(12) United States Patent
Hosek et al.

(10) Patent No.: US 10,792,822 B2
(45) Date of Patent: Oct. 6, 2020

(54) ROBOT DRIVE AND WIRELESS DATA COUPLING

(71) Applicant: Persimmon Technologies, Corp., Wakefield, MA (US)

(72) Inventors: Martin Hosek, Lowell, MA (US);
Tuan Ha, Randolph, MA (US);
Christopher Hofmeister, Hampstead, NH (US)

(73) Assignee: Persimmon Technologies Corporation, Wakefield, MA (US)

( * ) Notice: Subject to any disclaimer, the term of this patent is extended or adjusted under 35 U.S.C. 154(b) by 151 days.

(21) Appl. No.: 15/841,546

(22) Filed: Dec. 14, 2017

(65) Prior Publication Data
US 2018/0104830 A1 Apr. 19, 2018

Related U.S. Application Data

(62) Division of application No. 14/938,292, filed on Nov. 11, 2015, now Pat. No. 10,538,000, which is a
(Continued)

(51) Int. Cl.
*H01L 21/677* (2006.01)
*B25J 19/00* (2006.01)
(Continued)

(52) U.S. Cl.
CPC ........... *B25J 19/0054* (2013.01); *B25J 9/042* (2013.01); *B25J 11/0095* (2013.01); *H01L 21/67742* (2013.01); *H05K 7/2039* (2013.01)

(58) Field of Classification Search
CPC ..... B25J 9/04; B25J 9/041; B25J 9/042; B25J 9/046; B25J 9/047; B25J 9/1055;
(Continued)

(56) References Cited

U.S. PATENT DOCUMENTS

| 636,808 A | 11/1899 | Judy |
| 4,453,114 A | 6/1984 | Nordlund |

(Continued)

FOREIGN PATENT DOCUMENTS

| CN | 1411960 A | 4/2003 |
| CN | 1320595 C | 12/2004 |

(Continued)

OTHER PUBLICATIONS

Popan, A.D., Viorel, I.A., Blissenbach, R; A Passive Rotor Transverse Flux Motor; Technical University of Cluj, C. Daicoviciu No. 15, Cluj-Napoca, 3400, Romania,alin.popn@mae.utcluj.ro; Technical University of Cluj, C. Daicoviciu No. 15, Cluj-Napoca, 3400, Romania, ioan.adrian.viorel@mae.utcluj IEM-RWTH, Schinkelstrasse No. 4, D-52062, Aachen, Germany,blissenbach@iem.rwth-aachen.de.

*Primary Examiner* — Saul Rodriguez
*Assistant Examiner* — Brendan P Tighe
(74) *Attorney, Agent, or Firm* — Harrington & Smith

(57) ABSTRACT

An apparatus including a movable arm; a robot drive connected to the movable arm; and a heat transfer system. The robot drive includes a first drive configured to extend and retract the movable arm and a second drive configured to move the movable arm and the first drive along a linear path. The heat transfer system includes a first heat transfer member on the base and a second heat transfer member, where the heat transfer system is configured to transfer heat from the first drive to the first heat transfer member and then from the first heat transfer member to the second heat transfer member. The first heat transfer member travels with the base, and the first heat transfer member moves relative to the second heat transfer member as the base moves relative to the slide.

21 Claims, 17 Drawing Sheets

Related U.S. Application Data division of application No. 13/618,117, filed on Sep. 14, 2012, now Pat. No. 10,569,430.

(60) Provisional application No. 61/627,052, filed on Sep. 16, 2011, provisional application No. 61/678,721, filed on Aug. 2, 2012.

(51) Int. Cl.
*B25J 9/04* (2006.01)
*H05K 7/20* (2006.01)
*B25J 11/00* (2006.01)

(58) Field of Classification Search
CPC ..... B25J 9/12; B25J 9/123; B25J 9/126; B25J 9/14; B25J 9/142; B25J 9/144; B25J 9/146; B25J 11/0095; B25J 15/0014; B25J 17/025; B25J 17/0258; B25J 18/02; B25J 18/025; B25J 18/04; B25J 19/0041; B25J 19/0054; H01L 21/677; H01L 21/67703; H01L 21/67721; H01L 21/67739; H01L 21/67742; H01L 21/67766; H01L 2221/67; H01L 2221/683; H05K 7/2039; Y10S 901/16; Y10S 901/17; Y10S 901/23; Y10S 901/46; Y10S 901/47
USPC .............. 74/490.02, 490.03, 490.05, 490.06; 414/226.05, 744.3, 744.5, 744.7, 806, 414/918, 935, 941; 700/245, 258; 901/15, 16, 17, 23, 46, 47
See application file for complete search history.

(56) References Cited

U.S. PATENT DOCUMENTS

| | | | |
|---|---|---|---|
| 4,702,668 A | 10/1987 | Carlisle et al. | 414/744 |
| 5,106,316 A | 4/1992 | Bannai et al. | |
| 5,209,699 A | 5/1993 | Hashimoto et al. | 464/29 |
| 5,270,600 A | 12/1993 | Hashimoto | 310/75 |
| 5,658,899 A | 8/1997 | Hansen et al. | |
| 5,720,590 A | 2/1998 | Hofmeister | 414/744.2 |
| 5,834,865 A | 11/1998 | Sugiura | 310/49 |
| 5,899,658 A | 5/1999 | Hofmeister | 414/744.5 |
| 6,089,630 A | 7/2000 | Watanabe | |
| 6,153,828 A | 11/2000 | Murata et al. | 174/50 |
| 6,198,976 B1 | 3/2001 | Sundar et al. | |
| 6,298,684 B1 | 10/2001 | Mitsuyoshi | 414/939 |
| 6,463,360 B1* | 10/2002 | Terada | B25J 9/1679 318/568.12 |
| 6,568,899 B1 | 5/2003 | Muribayashi et al. | |
| 7,704,036 B2 | 4/2010 | Sato | 414/744.5 |
| 7,800,256 B2 | 9/2010 | Jajtic et al. | 310/12.01 |
| 7,898,135 B2 | 3/2011 | Flynn | 310/152 |
| 7,950,890 B2 | 5/2011 | Nakamura et al. | 414/217 |
| 8,461,514 B1 | 6/2013 | Rickenbach | |
| 9,947,564 B2 | 4/2018 | Hiroki et al. | |
| 2002/0029936 A1 | 3/2002 | McClintock et al. | 187/267 |
| 2003/0085681 A1 | 5/2003 | Sakamoto et al. | |
| 2005/0105991 A1 | 5/2005 | Hofmeister et al. | 414/217 |
| 2005/0111938 A1 | 5/2005 | Van der Meulen | |
| 2005/0166413 A1* | 8/2005 | Crampton | B25J 13/088 33/503 |
| 2005/0265814 A1 | 12/2005 | Coady | |
| 2006/0130750 A1 | 6/2006 | Ishikawa | |
| 2006/0155768 A1 | 7/2006 | Weil et al. | |
| 2006/0216137 A1 | 9/2006 | Sakata et al. | |
| 2008/0166210 A1 | 7/2008 | Hudgens | |
| 2009/0032223 A1 | 2/2009 | Zimmerman et al. | 165/104.19 |
| 2009/0243413 A1 | 10/2009 | Gilchrist et al. | |
| 2010/0068025 A1 | 3/2010 | Miyamoto et al. | |
| 2011/0077117 A1 | 3/2011 | Nakamura | |
| 2011/0089751 A1 | 4/2011 | Saillet | 301/95.103 |
| 2011/0156514 A1 | 6/2011 | Watanabe et al. | 310/86 |
| 2011/0178626 A1 | 7/2011 | Kondoh | 700/108 |
| 2012/0215358 A1 | 8/2012 | Gettings et al. | |

FOREIGN PATENT DOCUMENTS

| | | |
|---|---|---|
| CN | 1816907 A | 8/2006 |
| CN | 1902031 A | 1/2007 |
| CN | 102106062 A | 6/2011 |
| JP | H-05326671 A | 12/1993 |
| JP | H08-267386 A | 10/1996 |
| JP | H09-150388 | 6/1997 |
| JP | H09-314485 A | 12/1997 |
| JP | H-11114745 A | 4/1999 |
| JP | H11-216698 A | 8/1999 |
| JP | 2000212736 A | 8/2000 |
| JP | 2001-024045 A | 1/2001 |
| JP | 2001035902 A | 2/2001 |
| JP | 2003039376 A | 2/2003 |
| JP | 2004330321 A | 11/2004 |
| JP | 2006-159318 A | 6/2006 |
| JP | 2007038360 A | 2/2007 |
| JP | 2007122181 A | 5/2007 |
| JP | 2008028179 A | 2/2008 |
| JP | 2008-235836 A | 10/2008 |
| JP | 2008-258650 A | 10/2008 |
| JP | 2008-307636 A | 12/2008 |
| JP | 2009-111172 A | 5/2009 |
| JP | 2009111172 A | 5/2009 |
| JP | 2010037092 A | 2/2010 |
| JP | 2010040947 A | 2/2010 |
| JP | 2010171344 A | 8/2010 |
| JP | 2011-011316 A | 1/2011 |
| JP | 2011-078227 A | 4/2011 |
| JP | 2011-519259 A | 6/2011 |
| KR | 100581420 B1 | 8/2006 |
| KR | 100849511 B1 | 7/2008 |
| KR | 10-20100040067 A | 4/2010 |
| WO | WO 1997/03395 | 1/1997 |
| WO | WO-97/48126 A1 | 12/1997 |
| WO | WO-2006062183 A1 | 6/2006 |
| WO | WO-2008/120294 A1 | 10/2008 |
| WO | WO 2009/130473 A1 | 10/2009 |

* cited by examiner

ROBOT DRIVE AND WIRELESS DATA COUPLING

CROSS REFERENCE TO RELATED APPLICATIONS

This application is a divisional patent application of application Ser. No. 14/938,292 filed Nov. 11, 2015, which is a divisional patent application of application Ser. No. 13/618,117 filed Sep. 14, 2012, which claims priority under 35 USC 119(e) on Provisional Patent Application No. 61/627,052 filed Sep. 16, 2011 and Provisional Patent Application No. 61/678,721 filed Aug. 2, 2012, which are hereby incorporated by reference in their entireties.

BACKGROUND

Technical Field

The exemplary and non-limiting embodiments relate generally to a robot and, more particularly, to robot for moving a substrate.

Brief Description of Prior Developments

Conventional manufacturing technologies for semiconductor integrated circuits and flat panel displays often include processing of silicon wafers and glass panels, often referred to as substrates, in fully automated vacuum cluster tools. A typical cluster tool may include a circular vacuum chamber with load locks and process modules connected radially to the circumference of the chamber in a star pattern. The tool is typically serviced by a robotic manipulator (robot) which is located near the center of the chamber and cycles the substrates from the load locks through the process modules and back to the load locks. Another robot may be located in an atmospheric transfer module which serves as an interface between the load locks of the vacuum chamber and standardized load ports serviced by an external transportation system.

SUMMARY

The following summary is merely intended to be exemplary. The summary is not intended to limit the scope of the claims.

In accordance with one aspect, an example apparatus comprises a movable arm; a robot drive connected to the movable arm, where the robot drive comprises a first drive configured to extend and retract the movable arm and a second drive configured to move the movable arm and the first drive along a linear path, where the first drive comprises a rotary drive which comprises a rotational axis, where the linear drive comprises a base movably mounted on a slide, where the first drive is mounted on the base, and where the linear drive is configured to move the base on the slide in a direction perpendicular to the rotational axis of the rotary drive; and a heat transfer system comprising a first heat transfer member on the base and a second heat transfer member, where the heat transfer system is configured to transfer heat from the first drive to the first heat transfer member and then from the first heat transfer member to the second heat transfer member, where the first heat transfer member travels with the base, and where the first heat transfer member moves relative to the second heat transfer member as the base moves relative to the slide.

In accordance with another aspect, an example apparatus comprises a movable arm; a robot drive connected to the movable arm, where the robot drive comprises a first drive configured to extend and retract the movable arm and a second drive configured to move the movable arm and the first drive along a linear path, where the first drive comprises a rotary drive which comprises a rotational axis, where the linear drive comprises a base movably mounted on a slide, where the first drive is connected to the base, and where the linear drive is configured to move the base in a direction orthogonal to the rotational axis of the rotary drive; and a heat transfer system comprising a first heat transfer member on the base and a second heat transfer member, where the heat transfer system is configured to transfer heat from the first drive to the first heat transfer member and then from the first heat transfer member to the second heat transfer member, where the first heat transfer member moves relative to the second heat transfer member as the base moves relative to the slide; and an inductive coupling configured to provide an electrical power connection and/or a communication connection to the robot drive, where the inductive coupling comprises a first inductive coupling component on the base and a second inductive coupling component, where the first inductive coupling component moves relative to the second inductive coupling component as the base moves relative to the slide.

In accordance with another aspect, an example apparatus comprises a movable arm; a robot drive connected to the movable arm, where the robot drive comprises a first drive configured to extend and retract the movable arm and a second drive configured to move the movable arm and the first drive along a linear path, where the first drive comprises a rotary drive which comprises a rotational axis, where the linear drive comprises a base movable located on a slide, where the first drive is connected to the base, and where the linear drive is configured to move the base in a direct orthogonal to the rotational axis of the rotary drive; and a heat transfer system comprising a first heat transfer member on the base and a second heat transfer member, where the heat transfer system is configured to transfer heat from the first drive to the first heat transfer member and then from the first heat transfer member to the second heat transfer member, where the first heat transfer member travels with the base, where the first heat transfer member moves relative to the second heat transfer member as the base moves relative to the slide, where the heat transfer system further comprises at least one enclosure at least partially surrounding at least one heat generating component of the robot drive, where the at least one enclosure is configured to transfer heat from the at least one heat generating component to the first heat transfer member.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
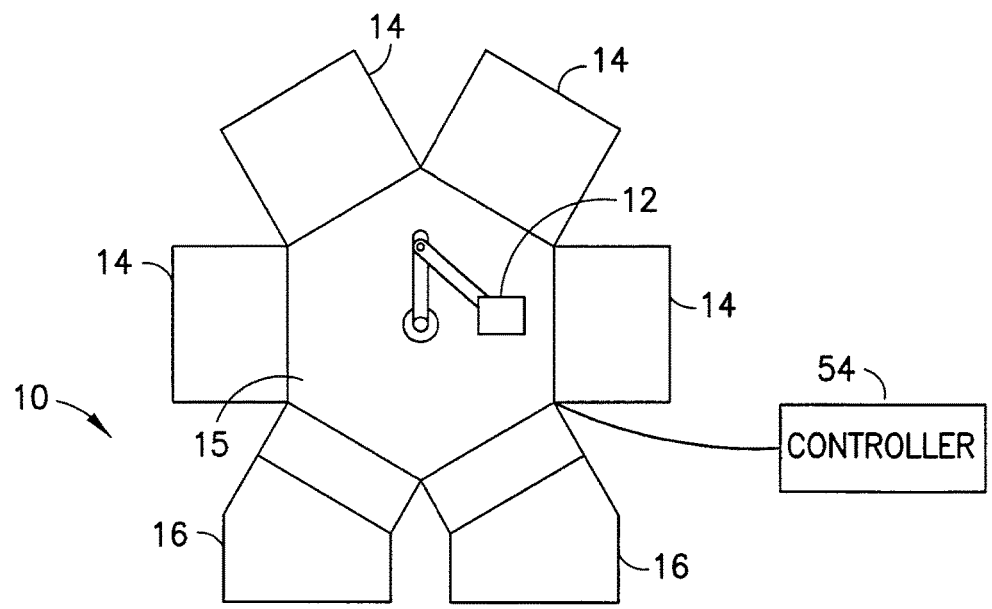
FIG. 1 is a schematic view of a substrate processing apparatus.

Referring to FIG. 1, there is shown a schematic top plan view of an example substrate processing apparatus 10 having a substrate transport apparatus 12. Although the present invention will be described with reference to the embodiments shown in the drawings, it should be understood that the present invention may be embodied in many forms of alternative embodiments. In addition, any suitable size, shape or type of materials or elements could be used.

In addition to the substrate transport apparatus 12, the substrate processing apparatus 10 includes multiple substrate processing chambers 14 and substrate cassette elevators 16 connected to a vacuum chamber 15. The transport apparatus 12 is located, at least partially, in the chamber 15 and is adapted to transport planar substrates, such as semiconductor wafers or flat panel displays, between and/or among the chambers 14 and elevators 16. In alternate embodiments, the transport apparatus 12 could be used in any suitable type of substrate processing apparatus.

A conventional vacuum environment robotic manipulator typically includes a drive unit which houses all active components of the robotic manipulator, e.g., actuators and sensors, and one or more arms, as discussed above, driven by the drive unit. The arm(s) are typically passive mechanisms, i.e., they do not include any active components, such as actuators and sensors. This is primarily due to difficulties with out-gassing, power distribution and heat removal in vacuum environments.

In a conventional vacuum environment robotic manipulator, since the arm(s) of the robotic manipulators are passive mechanisms, the number of independently driven links is limited to the number of motion axes provided by the drive unit and further constrained by the complexity of transmission of the actuation torques to the individual links of the arm(s). This may limit the arm configurations used in practice to the ones discussed above, which in turn may limit the reach and throughput performance of the existing vacuum environment robotic manipulators.

Furthermore, while atmospheric-environment robots often utilize various substrate grippers, vacuum-compatible robots typically hold the substrate subject to processing solely by means of frictional force between the substrate and the robot end-effector. Since the inertial force at the substrate must not exceed the holding force securing the substrate to the end-effector in order to prevent undesirable slippage, the acceleration of the substrate must be limited accordingly, resulting in limited throughput (number of substrates processed per hour) of the tool. Therefore, there is a need for a gripper, such as an edge-clamping mechanism or an electrostatic hold-down arrangement, that would eliminate the acceleration constraint due to substrate slippage. Furthermore, it is desirable to place sensors on the robot end-effector to assist with substrate alignment, or facilitate station teaching, or similar type operation.

Therefore, it is beneficial to supply electrical power and signals to the arm(s) and end-effector(s) of a vacuum-compatible robot. Conventional arrangements, such as slip-ring and rolling-contact rotary couplings or service loops, which have been designed for atmospheric applications and successfully utilized in atmospheric-environment robots, are difficult to employ in vacuum applications due to performance (cold welding) and out-gassing issues.

In summary, since the arm(s) of the robotic manipulators are passive mechanisms, the number of independently driven links is limited to the number of motion axes provided by the drive unit and further constrained by the complexity of transmission of the actuation torques to the individual links of the arm(s), and the use of substrate gripping and sensing arrangements is virtually non-existent in vacuum environment applications. This limits the reach, throughput performance and substrate placement repeatability of the existing vacuum environment robotic manipulators. Therefore, it would be advantageous to provide a robotic system with active components, such as actuators and sensors, located within the vacuum environment or other non-atmospheric environment that the arm(s) of the robotic manipulator may operate in.

Figure 2:
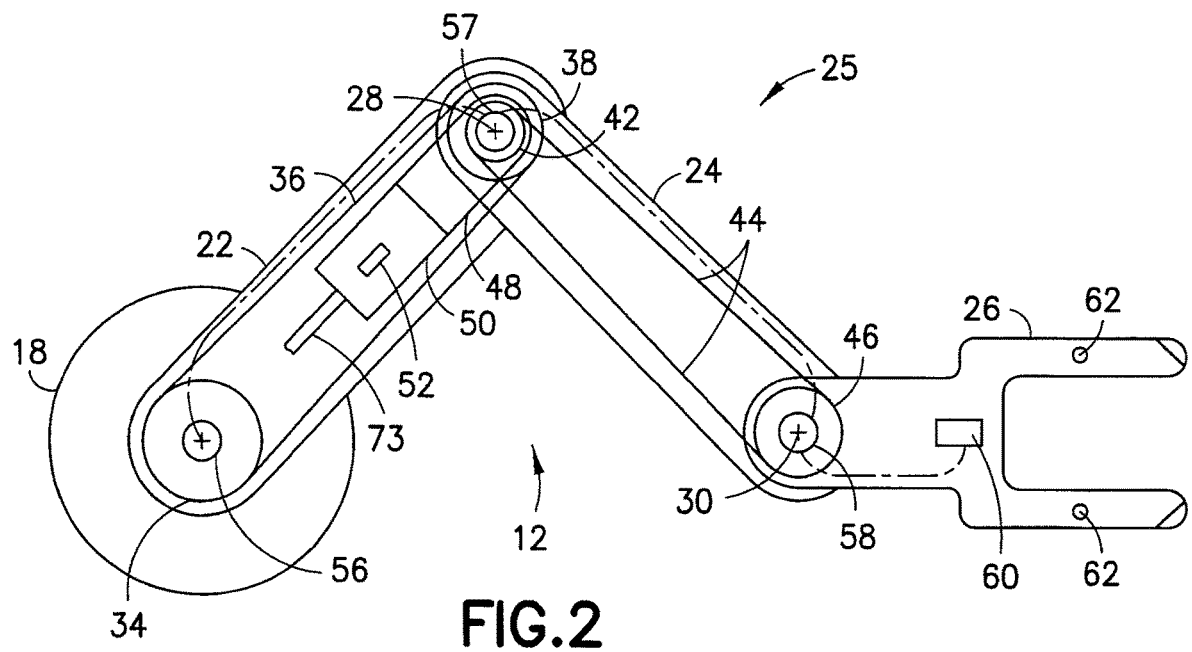
FIG. 2 is a top view of a substrate transport apparatus of the substrate processing apparatus shown in FIG. 1.

Referring also to FIG. 2, substrate transport apparatus 12 (or vacuum-compatible robot system) provides improved features over conventional apparatus. The substrate transport apparatus 12 includes a drive 18 and a frame 20. The frame 20 includes members including at least two links 22, 24 which form an arm assembly 25 and an end effector 26. The drive 18 has two rotary axes. The arm assembly 25 is coupled to the drive 18. The arm assembly 25 may include a first link 22, a second link 24 and the end-effector 26. The first link 22 is attached directly to a first rotary axis of the drive 18. The second link 24 is coupled to the first link 22 through a first rotary joint 28. The end-effector 26 is coupled to the second link 24 through a second rotary joint 30. The second link 24 is driven through a belt/band drive which may include a first pulley 34, attached to a second rotary axis of the drive 18, a first belt/band 36 and a second pulley 38, attached to the second link 24 of the arm assembly 25. The end-effector 26 is constrained to point approximately in a radial direction with respect to the drive 18 through another belt/band arrangement, which may include a third pulley 42, pivotably coupled to the first link 22, a second belt/band 44 and a fourth pulley 46, attached to the end-effector 26. In various different example embodiments, any suitable drive, actuator, sensor or otherwise may provide features as disclosed herein; in any combination and/or as disclosed in U.S. patent application Ser. No. 13/618,315, filed on the same date herewith, based upon U.S. Provisional Patent Application No. 61/627,030 filed Sep. 16, 2011 and U.S. Provisional Patent Application No. 61/683,297 filed Aug. 15, 2012, which are all hereby incorporated by reference in their entireties herein.

The third pulley 42 is phased with respect to the first link 22 of the arm assembly by a first actuator 48, which may adjust the orientation of the third pulley 42 relative to the first link 22 of the arm assembly within a given range. Preferably, the first actuator 48 may be self-locking, that is, it may not be back-driven when torques are applied to the third pulley. For example, the first actuator 48 may include an electric motor with a lead-screw mechanism or a worm-drive arrangement, a piezoelectric actuator, or any other suitable actuation arrangement. The first actuator 48 may also include a position measurement device to determine angular orientation of the third pulley 42 with respect to the first link 22 of the arm assembly. The active components of the first actuator, such as the stator of an electric motor for example, may be, or may not be, housed completely, partially or otherwise in an airtight vessel 50 and separated from the passive components, such as the rotor of an electric motor, by a separation barrier. The first actuator 48 is connected to a cooling subsystems, such as the exemplary cooling subsystem discussed below.

The first actuator 48 is controlled by the first controller unit 52, which may be coupled to the first link 22 of the arm assembly. The first controller unit 52 may be housed in the same airtight vessel 50 as the first actuator 48, or located in another airtight vessel (not shown). The first controller unit 52 is connected to the cooling subsystem, such as one of the exemplary cooling subsystems described below for example. The first controller unit 52 may process signals provided by the position sensing device in the first actuator 48 and provide control signals to the first actuator 48. For example, to energize windings of an electrical motor incorporated into the actuator. The first controller unit 52 may receive power and communicate with the robot controller 54 through a power distribution and communication subsystem as further described below.

The power distribution and communication subsystem may include electrical rotary couplings 56, 57, 58 located at or associated with each rotary joint of the robotic manipulator 25. The rotary couplings 56, 57, 58 may transmit power from the robot controller 54 to the first controller unit 52 and other active components of the arm assembly 25, such as a gripper 60 and sensors 62 on the end-effector 26. Examples of electrical rotary couplings in accordance with one or more embodiments of the vacuum-compatible robot arm system are discussed below.

The end-effector 26 may feature an active substrate gripper 60, which may utilize, for example, an electrically actuated edge-clamping mechanism, an electrostatic hold-down arrangement, or similar type device. The gripper(s) may be connected to the power distribution and communication subsystem as well as the cooling subsystem of the robot arm assembly as further described below. The arm system according to the one or more embodiments may utilize rotary electrical couplings 56-58 to transmit electrical power and/or signals through various rotary joints. The electrical couplings 56-58 may be of continuous rotation type or limited rotation type for example. The gripper may incorporate features as disclosed in U.S. Provisional patent application No. 61/629,838 filed Nov. 29, 2011 entitled "Vacuum Compatible Robot Gripper" which is hereby incorporated by reference in its entirety. However, in other example embodiments, any suitable gripper(s) may be provided.

Figure 3:
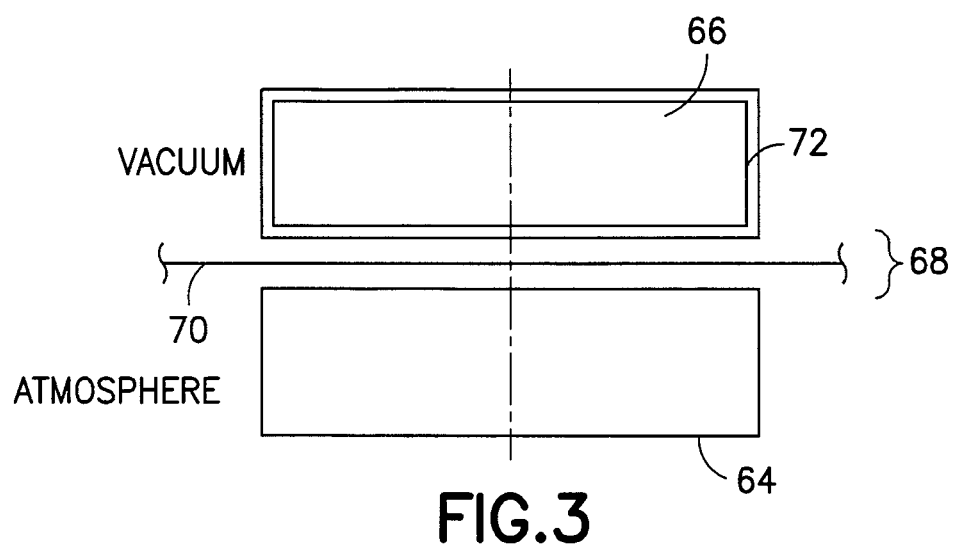
FIG. 3 is a schematic view illustrating a barrier between a vacuum compatible module and an atmospheric module.

One example continuous rotation coupling may be based on an inductive principle. As shown in FIG. 3, the exemplary continuous rotation coupling 56 may include of an atmospheric module 64 and a vacuum-compatible module 66 arranged so that the two modules can interact with each other across a gap 68. A separation barrier 70 may be present in the gap to separate the environment in which the atmospheric module 64 resides from the environment in which the vacuum-compatible module 66 resides. The two modules 64, 66 include one or more rotary transformers. For transmission of power and/or signals from the atmospheric environment to the vacuum environment, the primary windings of the rotary transformers may be located in the atmospheric module 64 and the corresponding secondary windings may be located in the vacuum-compatible module 66. For transmission of signals from the vacuum environment to the atmospheric environment, the primary windings of the rotary transformers may be located in the vacuum-compatible module 66 and the corresponding secondary windings may be located in the atmospheric module 64. Typically, the atmospheric module resides in an atmospheric environment and the vacuum module resides in a vacuum or other non-atmospheric environment. The vacuum-compatible module 66 may include an airtight vessel 72 that encapsulates the contents of the vacuum-compatible module, e.g., to prevent out-gassing. The vacuum-compatible module 66 may be connected to the cooling subsystem of the robot arm system, such as the exemplary cooling subsystem described below.

Another example of the continuous rotation coupling according to one or more embodiments of this invention may combine inductive principle for power transmission and wireless network based arrangement for communication.

Figure 4:
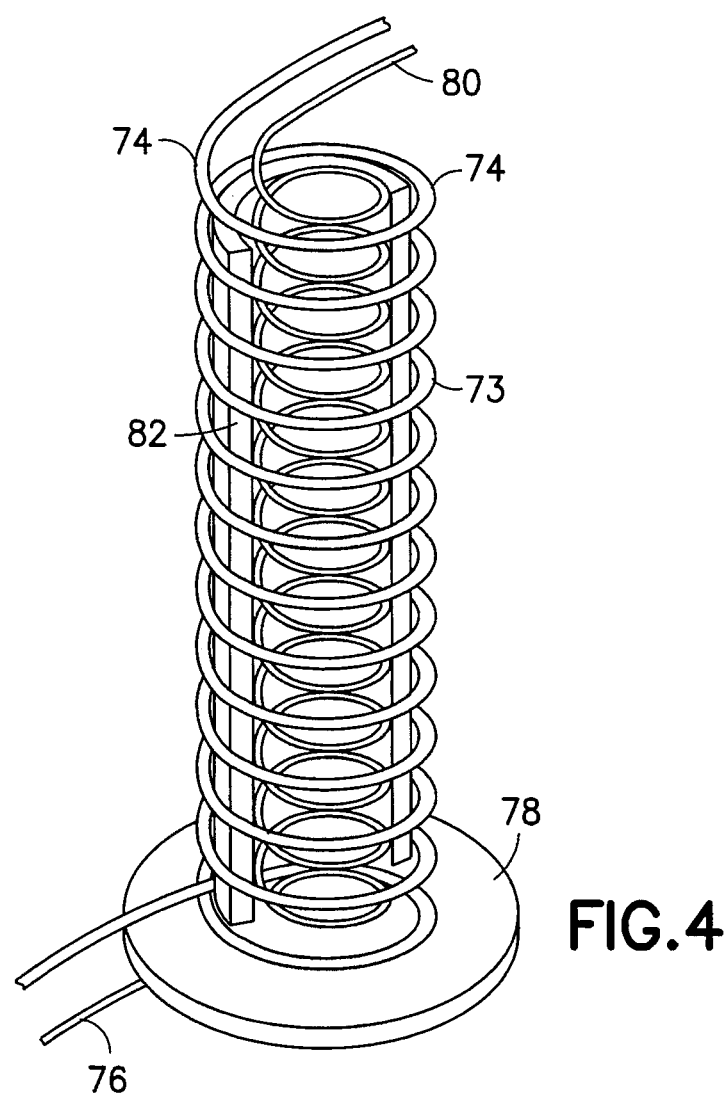
FIG. 4 is a prospective view of a communication/power flexure.

One example of the limited-rotation flexure coupling is shown in FIG. 4. In this example, each power and/or communication signal is carried by a one or more conductors 73 (see FIG. 2); a portion of which is provided in a helical coil flexure 74. One end 76 of the helical coil flexure 74 may be coupled, preferably through an insulator 78, to one component of the robot, and the other end 80 of the helical coil flexure 74 may be coupled, preferably through an insulator, to another component of the robot, where the two components may be coupled through one of the rotary joints. Multiple helical coil flexures 74 may be arranged at a rotary joint in a substantially coaxial manner to provide path for several power and/or communication signals. Individual helical coil flexures may be wound in opposite directions so that the restoring forces associated with individual helical coil flexures are balanced as much as possible regardless of the displacement of the rotary joint. Insulation cylinders 82 may be utilized between individual helical coil flexures to eliminate risk of shorts between neighboring helical coil flexures. For example, two helical coil flexures 74 are shown in FIG. 4 for clarity of illustration. However, any suitable number of helical coil flexures may be used, such as one or more than two.

Figure 5:
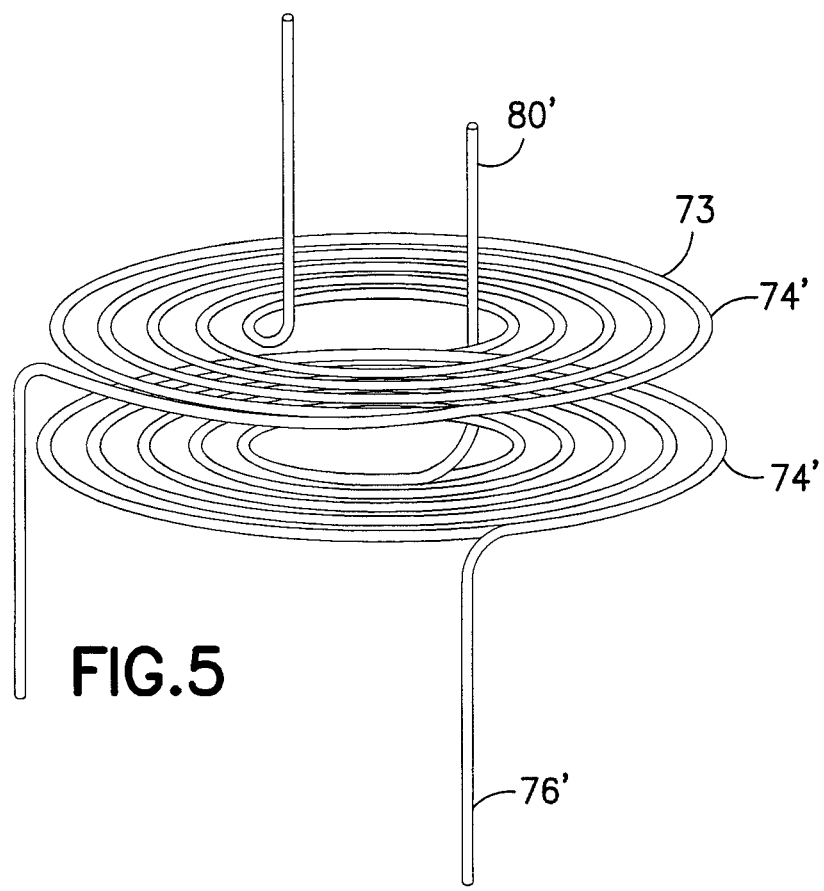
FIG. 5 is a prospective view of another communication/power flexure.

Another example of the limited-rotation flexure coupling of this invention is shown in FIG. 5. In this example, each power and/or communication signal may be carried by a spiral coil flexure 74'. Two of the spiral coil flexure 74' are shown in FIG. 5. One end 76' of the spiral coil flexure may be coupled, preferably through an insulator, to one component of the robot, and the other end 80' of the spiral coil flexure may be coupled, preferably through an insulator, to another component of the robot, where the two components may be coupled through a rotary joint. Multiple spiral coil flexures may be stacked to provide path for several power and/or communication signals. Individual spiral coil flexures may be wound in opposite directions so that the spring forces associated with individual spiral coil flexures are balanced as much as possible regardless of the displacement of the rotary joint. Insulation disks may be utilized between individual spiral coil flexures to eliminate risk of shorts between neighboring spiral coil flexures. Although two spiral coil flexures are shown in FIG. 5 for clarity of illustration, any suitable number of spiral coil flexures may be used.

The number of helical and spiral coil flexures utilizes in a single rotary coupling may relate to the number of power and communication signals transmitted through the rotary joint. A single signal may be distributed among multiple helical and spiral coil flexures to reduce current density or for redundancy purposes.

The purpose of the cooling subsystem that may be used in accordance with the vacuum-compatible robot arm assembly is to remove the heat generated by active components incorporated into the robot arm assembly which is difficult in vacuum compared to atmospheric application due to the lack of convection through the surrounding air. Heat conduction is also limited due to a long pass from the sources of the heat to the drive unit, and radiation provides limited effect at low temperatures.

Figure 6:
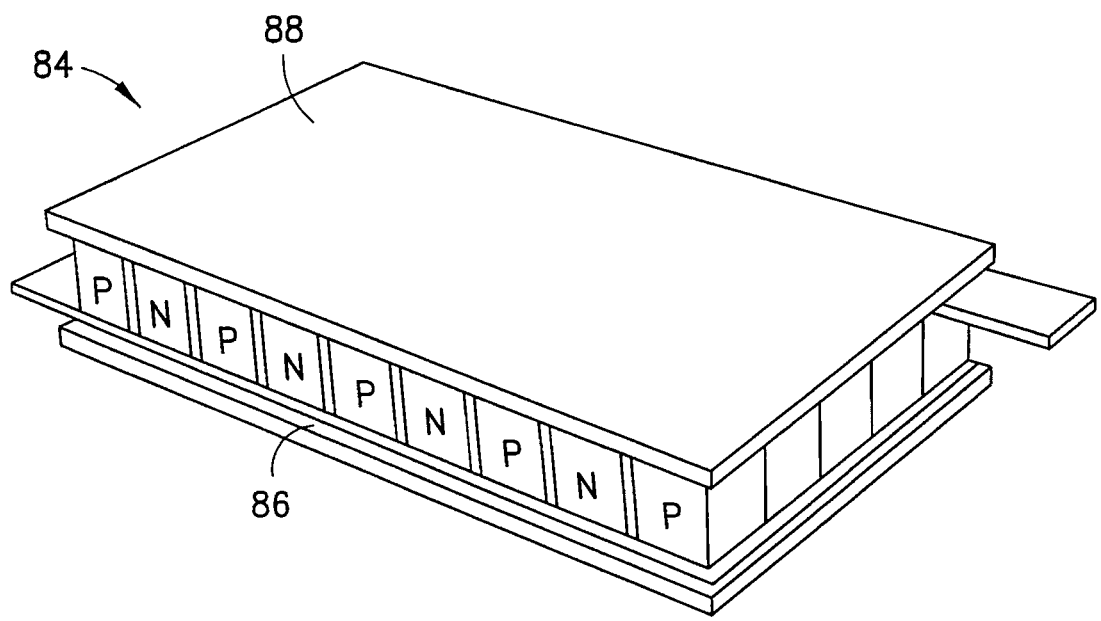
FIG. 6 is a perspective view of a cooling system.

For example, the cooling subsystem that may be used with the vacuum-compatible robot arm system may include a heat sink which may be connected to an active component generating heat, a radiator, which may be, exposed to the outside of the robot arm assembly, and a thermoelectric cooling device connected to the heat sink and the radiator. FIG. 6 shows an example of a thermoelectric cooling device 84 may be a solid-state active heat pump, which transfers heat from the heat sink side (cold side) 86 of the device to the radiator side (hot side) 88 against the temperature gradient (from cold to hot), with consumption of electrical energy. The main advantages of the thermoelectric cooling device are its lack of moving parts or circulating liquid, and its small size and flexible shape (form factor).

Alternatively, the cooling subsystem may utilize any suitable heat pump, a fluid, either liquid or gas, circulating through heat sinks connected to active, heat-generating components in the arm assembly and either exhausted from the system or fed into radiators, preferably built into the robot drive unit, which may be exposed to the surrounding atmosphere. The fluid may be routed through the joints of the robot system in vacuum-compatible houses arranged in a manner similar to the flexure shown in FIGS. 4 and 5.

Figure 7:
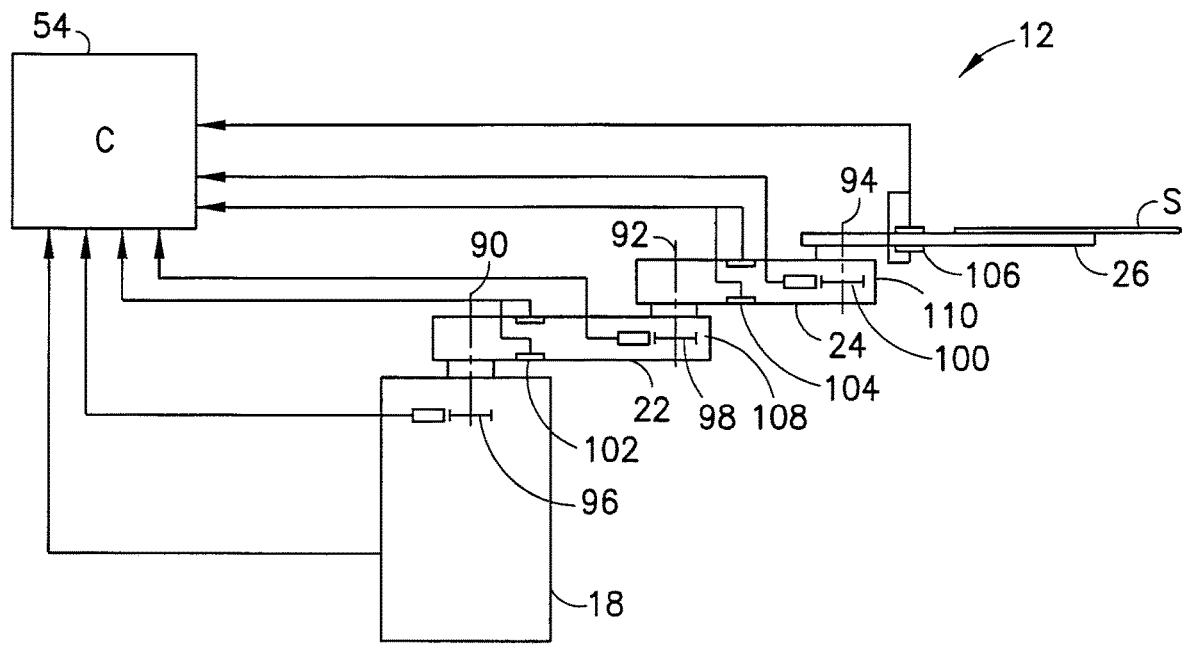
FIG. 7 is a diagram illustrating components of the apparatus shown in FIG. 2.
Figure 8:
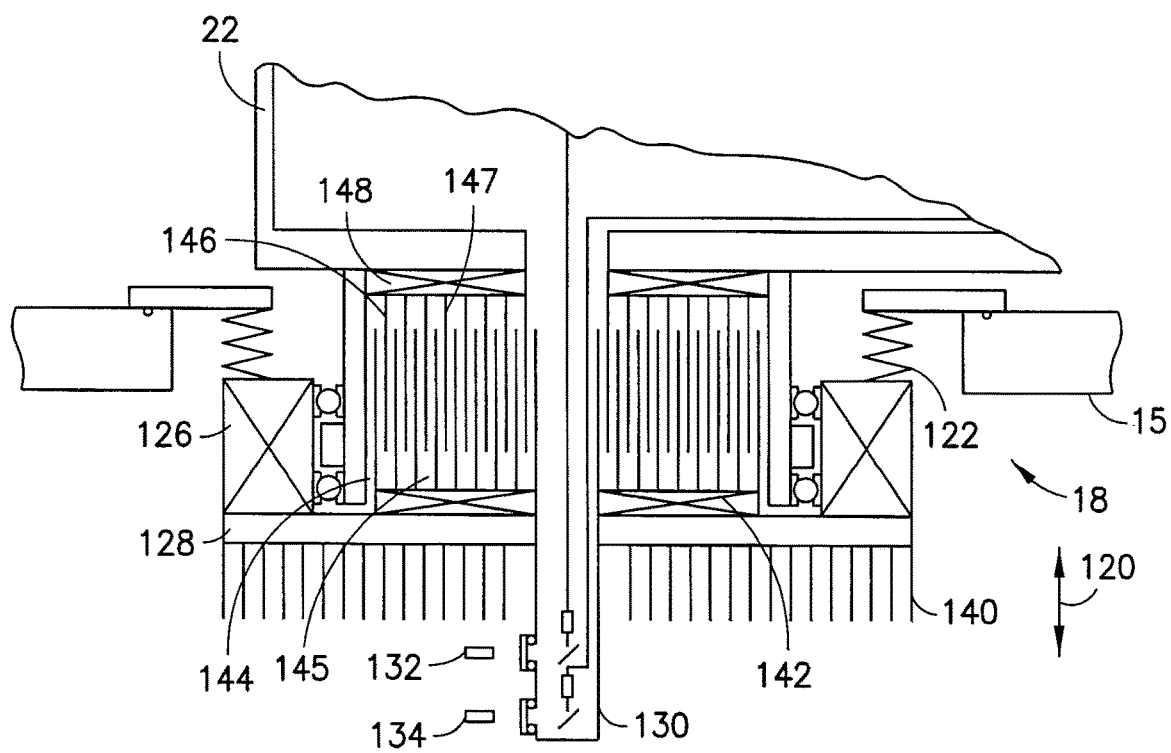
FIG. 8 is a diagram illustrating a cooling system of the apparatus shown in FIG. 2.

Referring also to FIGS. 7 and 8, the substrate transport apparatus 12 is shown in different schematic diagrams. Although the substrate transport apparatus 12 is described with respect to a vacuum robot, any suitable substrate transport apparatus; atmospheric or otherwise may be provided having features as disclosed. substrate transport apparatus 12 has controller 54, drive unit 18 and arm 25, and is configured to transport substrate S. Controller 54 may have a processor, memory and power amplifiers or otherwise. Arm 25 is shown as a SCARA type arm and driven by drive unit 18. Although substrate transport apparatus 12 is described with respect to a two link arm, any suitable number of links may be provided. Further, any suitable number of arms may be provided. Further, any combination of rotary and/or linear axis may be provided on any suitable arm.

In the embodiment shown, arm 25 has three rotary axes 90, 92, 94. Directly coupled to each axis is a position detection device 96, 98, 100 respectively. The position detection devices may be optical, inductive or any suitable position detection devices. The position detection devices 96, 98, 100 may be incremental, absolute or a combination of incremental and absolute. Position detection devices 96, 98, 100 may be used in combination with additional position detection devices within driven axes of drive 18. Position detection devices 96, 98, 100 interface with controller 54 such that the positions of joints 92, 94, 96 are known; as opposed to robot drives not having position detection devices directly at the joint. Alternately, less than all the joints may have position detection devices. Position detection devices 96, 98, 100 may interface with controller 54 with signals routed through the arm and drive and with the signals being electrical, optical or otherwise. Alternately, wireless or other suitable noncontact communication may be provided. Here, hysteresis is not a factor in the position accuracy of the substrate transport apparatus 12 given the direct position detection of each joint.

Drive 18 may further contain motors and additional position detection device(s) where controller 54 interfaces with drive 18 and position detection devices 96, 98, 100 and utilizes a control algorithm to minimize vibration at payload S and maximize position repeatability upon picking and placing payload S. Temperature detection devices 102, 104, 106 may further be coupled to each link 22, 24, 26 to detect a temperature of one or more portions of each link. Temperature detection devices 102, 104, 106 further may be connected to controller 54 and thermal effects, such as thermal expansion or thermal based deflection may be factored into determining the location of the end effector 26. In addition to, or as an alternative to, temperature detection devices 102, 104, 106, vibration detection devices 108 and/or deflection detection devices 110, connected to the controller 54, may be provided such that vibration may be monitored and deflection may be factored into positioning and smoothness. In alternate example embodiments, any of the devices may be fastened to any suitable component, and may or may not be heat sunk. In alternate aspects, each device may be coupled to one or more controllers, such as 52 for example, within one or more links.

Referring also to FIG. 8, cooling subsystem of the substrate transport apparatus 12 of FIG. 2 is shown. The drive 18 is a two axis drive. The drive 18 has a vertical drive 120 and a bellows 122, and is coupled to vacuum chamber 15. The drive 18 further has rotary drive 126, for example, having a stator coupled to base 128 and bellows 122. Rotary drive 126 directly rotates link 22, and may have a gear driven or directly driven motor, a position encoder and a power coupling where the power coupling may be a contactless rotary power coupling or any suitable power coupling providing power to link 22. Here, the power coupling may be an contactless inductive transformer where power and/or communications may be fed in a contactless manner. Alternately, power and/or data may be transmitted with a contact based or other suitable slip ring or coupling. Drive 18 further has contactless optical feed through 130 having first and second fiber optic channels 132, 134 that feed high speed communication to controller(s) in link 22. Here, controllers 52 may have optic to ethercat or other suitable conversion devices. Alternately, the conversion device and feed through 130 may be inductive, for example, a coupler that transmits both power and high frequency signals or data, such as CAN or otherwise and used in combination with wires, flexures or otherwise.

A suitable contactless optical feed through may utilize stationary grin lenses and stationary mirrors. An example of such feed through is provided by Moog Components Group, however, adapted for vacuum use. Alternately, any suitable coupling or feed through may be provided. Here, contactless fiber optic high speed communication coupled with contactless rotary power provide controller(s) 52 that which is necessary to drive arm 25. In addition to the high speed communication coupling, a non-contact inductive power coupling may be provided. Drive 18 further has heat sink 140 or 84 in atmosphere and may have thermoelectric cooler 142 in vacuum or atmosphere. Radiation sink 144 is coupled to base 128 where radiation sink 144 may have a series of concentric tubes 145 having high emissivity. Similarly, radiation sink 146 is coupled to thermoelectric cooler 148 which in turn is coupled to the body of link 22. Radiation sink 146 has a series of concentric tubes 147 having high emissivity and interleaved with the tubes 145 of sink 144. Here, coolers 142, 148 act to pump heat from the body of link 22 through the radiation cooling coupling 144, 146 and to be dissipated using sink 140.

Similarly, any joint may utilize such a thermal coupling. As an alternative, any suitable heat pump may be provided, for example, a phase change heat pump, that cools an active component and heats any suitable radiator to a considerably higher temperature. This allows for a more effective heat transfer using a smaller surface area as the amount of radiated heat depends on the fourth power of the temperature. Alternately, heat may be radiated to the outside of the arm as opposed to cooled heat sinks or through a series of thermal couplings, for example, the prior described mechanism may be suitable. Alternately, closed-loop cooling circuits may be provided within individual sections of the robot, such as within the links of the arm. As an example, these circuits may be heat pumps similar to those used in computers where the heat pump(s) may be completely sealed with substantially no leaks or out-gassing. Alternatively, in alternative example embodiments, no active cooling or cooling accommodations may be provided.

Coupling 144, 146 may be made from coated aluminum, for example with aluminum nitride ceramic or otherwise. Alternately, any suitable material may be provided. Module(s) 136 may be thermally sunk to cooler 148 or the housing or body of link 22. Module(s) 136 may have control and motor drive circuitry, position encoding read head(s), inputs or outputs for external devices such as thermoelectric cooler 148 or other read heads and edge grip actuators or otherwise.

Figure 9:
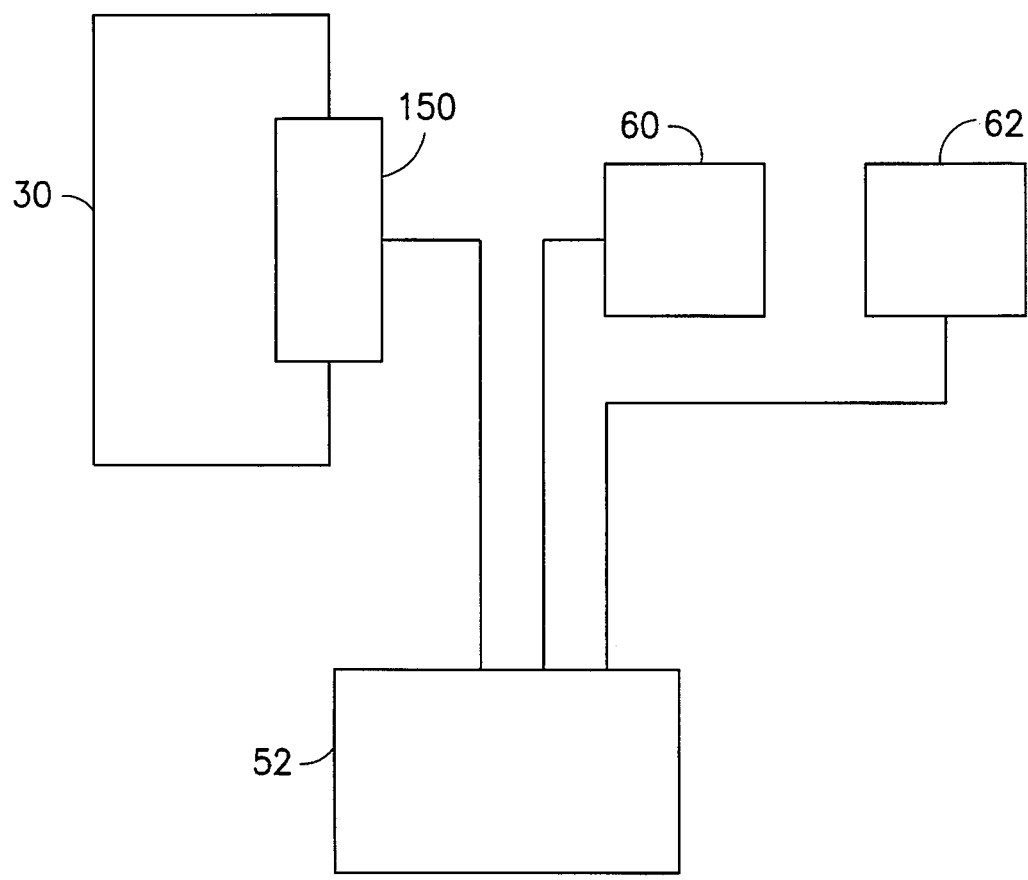
FIG. 9 is a diagram illustrating some connections of components of the apparatus shown in FIG. 2.

For example, referring also to FIG. 9, encoder 150 may be directly coupled to the wrist joint 30 associated with end effector 26 with a read head interfacing with module 52. Similarly, edge detection devices or edge grip or edge location devices 62, 60 may be coupled to end effector 26 and interfacing with module 52. In the disclosed embodiment, encoders may be provided at some or each joint, motors may be provided at some or each joint, the combination of motors, encoders and controllers may be provided at some or each joint. In alternate aspects, components within module(s) 52 or otherwise may be exposed, encapsulated, encapsulated within a sealed metal enclosure, encapsulated within the body of link 22, encapsulated within a partial metal enclosure or combination thereof. Power and communication may be by cable and stationary feed through, contactless magnetic slip ring, contact based slip rings, through isolated bearing(s), flexures or otherwise or combinations thereof. Thermal sinking may be by radiation cooling, or by convection and conduction, for example, where a cooling medium is passed through a feed through; either stationary or rotary. In alternate aspects, one or more axes may be provided with a feed through, for example, ferrofluidic or other suitable seal. In alternate aspects, more links, for example concentric with or offset from drive 18 may be provided having one, more or all independent axes of motion. Additionally, more or less cooling may be provided, for example, where one or more thermoelectric coolers may not be provided or where additional thermoelectric coolers may be provided. Further, a heat pump may be provided to transfer heat from one portion of the arm or drive to another for dissipation.

Figure 10:
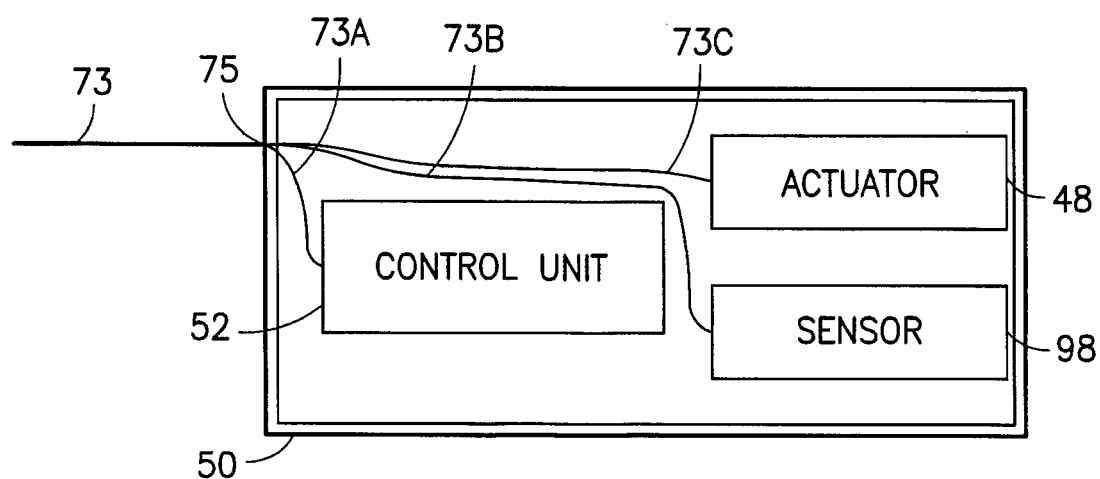
FIG. 10 is a diagram illustrating an airtight enclosure of the apparatus shown in FIG. 2.

Referring also to FIG. 10, the airtight vessel or enclosure 50 is shown. In this example the airtight enclosure comprises the actuator 48, the control unit 52 and at least part of the sensor 98 therein. In an alternate example, one or more of these components might not be provided. Each component 48, 52, 98 have power and/or communication conductors 73A, 73B, 73C which extend through the airtight enclosure 50 into the conductor 73, such as through a seal 75 for example. The conductors 73A, 73B, 73C may be electrical and/or optical. The enclosure 50 protects the inside of the vacuum chamber 15 from any gas or contaminant from the components 48, 52, 98 which otherwise might contaminate the vacuum enclosure 15. In alternative alternate example embodiments, the airtight enclosure may or may not be provided. In alternative alternate example embodiments, the enclosure may only enclose a portion of a given device(s). For example, a portion of a motor or a portion of a sensor may be exposed to vacuum, or the entire motor or sensor may be exposed, or the entire motor or sensor may be sealed in the enclosure. This applies for any type of device which might be enclosed in an airtight enclosure.

Figure 11:
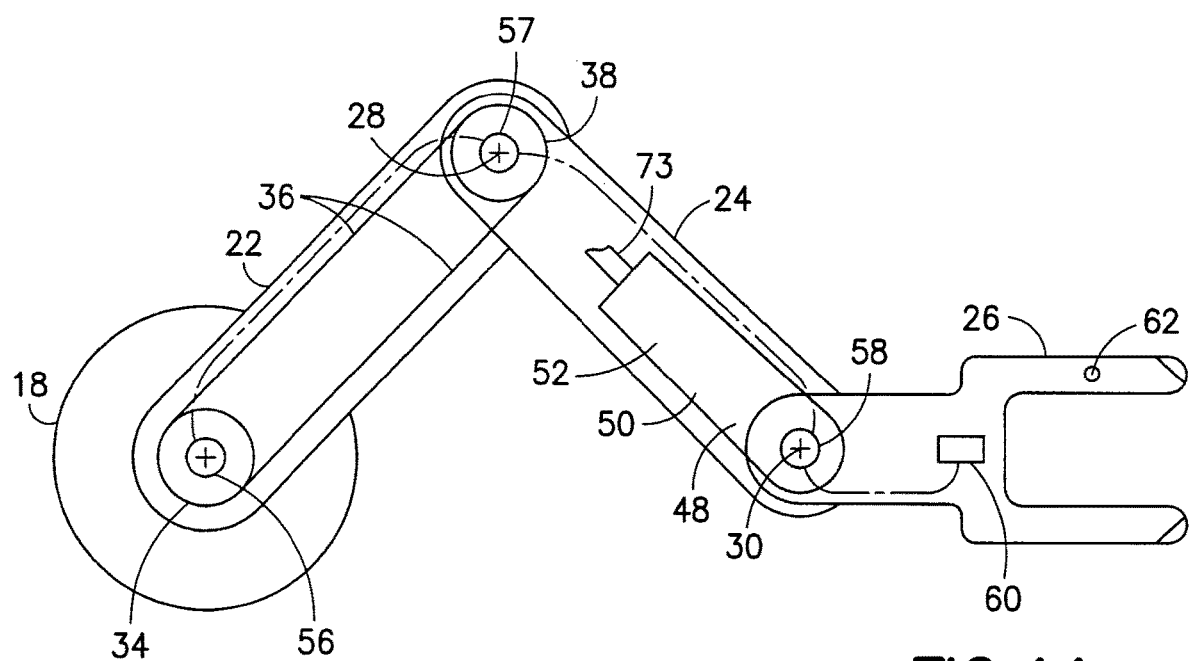
FIG. 11 is a top view similar to FIG. 2 of an alternate substrate transport apparatus of the substrate processing apparatus shown in FIG. 1.

Referring also to FIG. 11, another example embodiment of the vacuum-compatible robot arm system is shown having a single arm with two links 22, 24 and a pivoting end-effector 26. In this example, the robot system may include a drive unit with at least two rotary axes and an arm assembly coupled to the drive unit. The arm assembly may include a first link 22, a second link 24 and an end-effector 26, where the first link may be attached directly to a first rotary axis of the drive unit 18, the second link 24 may be coupled to the first link through a first rotary joint, and the end-effector may be coupled to the second link through a second rotary joint. The second link 24 may be driven through a belt/band drive comprising a first pulley 34, which may be attached to a second rotary axis of the drive unit 18, a first belt/band 36 and a second pulley 38, which may be attached to the second link of the arm assembly.

The end-effector 26 may be actuated by a first actuator 48, which may control the orientation of the end-effector 26 relative to the second link 24 of the arm assembly. For example, the first actuator 48 may include an electric motor, a piezoelectric actuator, or any other suitable actuation arrangement. The first actuator 48 may also include a position measurement device 100 to determine angular orientation of the end-effector 26 with respect to the second link 24 of the arm assembly. The active components of the first actuator, e.g., the stator of an electric motor, may be housed in an airtight vessel 50 and separated from the passive components, such as the rotor of an electric motor, by a separation barrier. The first actuator may be connected to a cooling subsystem, such as the cooling described above.

The first actuator 48 may be controlled by the first controller unit 52, which may be coupled to the second link of the arm assembly. The first controller unit may be housed in the same airtight vessel 50 as the first actuator or located in another airtight vessel. The first controller unit 52 may be connected to a cooling subsystem, such as the example cooling subsystem described above. The first controller unit 52 may process signals provided by the position sensing device 100 in the first actuator and provide control signals to the first actuator 48, e.g., energize windings of an electrical motor incorporated into the actuator. The first controller unit may receive power and communicate with the robot controller 54 through a power distribution and communication subsystem 73.

The power distribution and communication subsystem may include electrical rotary couplings located at or associated with each rotary joint of the robotic manipulator. The rotary couplings may transmit power from the robot controller to the first controller unit and other active components of the arm assembly, such as a gripper and sensors on the end-effector.

Figure 12:
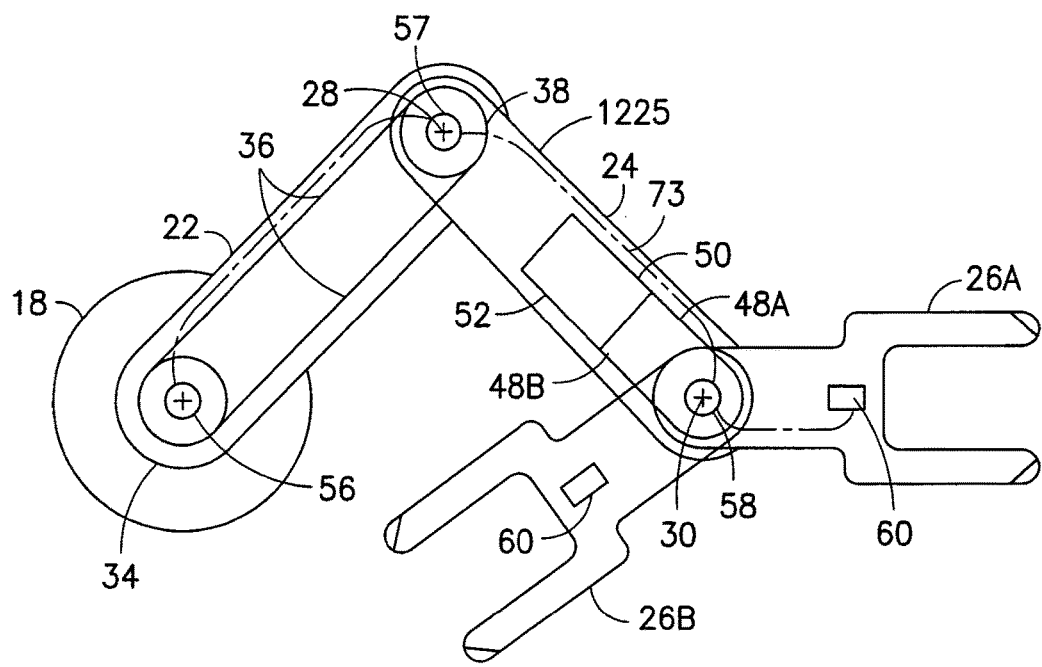
FIG. 12 is a top view similar to FIG. 2 of another alternate substrate transport apparatus of the substrate processing apparatus shown in FIG. 1.

Another example embodiment of the vacuum-compatible robot arm system is shown in FIG. 12. In this example, the robot system may include of a drive unit 18 with at least two rotary axes and an arm assembly 1225 coupled to the drive unit. The arm assembly may include a first link 22, a second link 24 and two end-effectors 26A, 26B, often referred to as the first end-effector and the second end-effector. The first link 22 may be attached directly to a first rotary axis of the drive unit 18, the second link 24 may be coupled to the first link through a first rotary joint 28, and the first and second end-effectors 26A, 26B may be coupled to the second link 24 through a second rotary joint 30 and a third rotary joint 31, respectively. The second link 24 may be driven through a belt/band drive comprising a first pulley 34, which may be attached to a second rotary axis of the drive unit, a first belt/band 36 and a second pulley 38, which may be attached to the second link 24 of the arm assembly 1225.

The first end-effector 26A may be actuated by a first actuator 48A, which may control the orientation of the first end-effector relative to the second link of the arm assembly. Similarly, the second end-effector 26B may be actuated by a second actuator 48B, which may control the orientation of the second end-effector 26B relative to the second link 24 of the arm assembly. For example, the first and second actuators 48A, 48B may include an electric motor, a piezoelectric actuator, or any other suitable actuation arrangement. The first and second actuator 48A, 48B may also include a position measurement device to determine angular orientation of the corresponding end-effector with respect to the second link of the arm assembly. The active components of the first and second actuators, e.g., the stator of an electric motor, may be housed in an airtight vessel 50 and separated from the passive components, such as the rotor of an electric motor, by a separation barrier. A single airtight vessel may be used for both actuators 48A, 48B or, alternatively, each actuator may be housed in its own airtight vessel. The first and second actuators may be connected to a cooling subsystem, such as the exemplary cooling subsystem described above.

The first and second actuators 48A, 48B may be controlled by the first controller unit 52, which may be coupled to the second link of the arm assembly. The first controller unit may be housed in the same airtight vessel 50 as the first and second actuators or located in another airtight vessel. The first controller unit may be connected to a cooling subsystem, such as the exemplary cooling subsystem discussed above. The first controller unit 52 may process signals provided by the position sensing devices in the first and second actuators, and provide control signals to the first and second actuators, for instance, energize windings of electrical motors incorporated into the actuators. The first controller unit may receive power and communicate with the robot controller through a power distribution and communication subsystem.

The power distribution and communication subsystem may include electrical rotary couplings located at or associated with each rotary joint of the robotic manipulator. The rotary couplings may transmit power from the robot controller to the first controller unit and other active components of the arm assembly, such as a gripper and sensors on the end-effector. Alternatively, two separate controller units may be used; one for the first actuator 48A and the other for the second actuator 48B.

Figure 13:
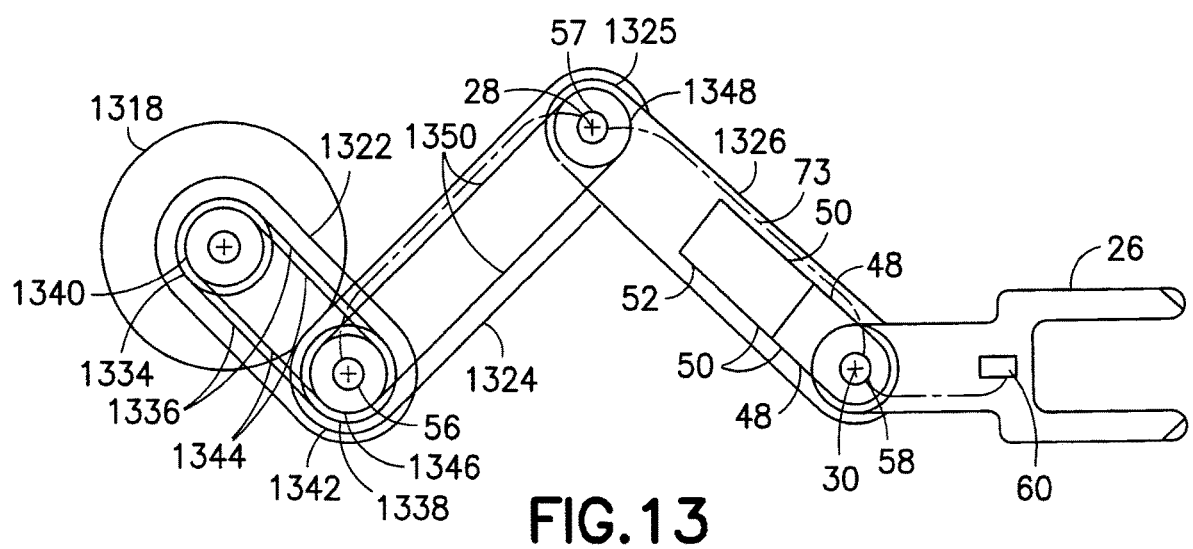
FIG. 13 is a top view similar to FIG. 2 of another alternate substrate transport apparatus of the substrate processing apparatus shown in FIG. 1.

Another embodiment of the vacuum-compatible robot arm system of this invention is shown in FIG. 13. In this example, the robot system consists of a drive unit 1318 with at least three rotary axes and an arm assembly 1325 coupled to the drive unit. The arm assembly 1325 may include of a first link 1322, a second link 1324, a third link 1326 and an end-effector 26. The first link 1322 may be attached directly to a first rotary axis of the drive unit, the second link 1324 may be coupled to the first link through a first rotary joint, the third link 1326 may be coupled to the second link via a second rotary joint, and the end-effector 26 may be coupled to the third link through a third rotary joint. The second link 1324 may be driven through a belt/band drive comprising first pulley 1334, which may be attached to a second rotary axis of the drive unit 1318, a first belt/band 1336 and a second pulley 1338, which may be attached to the second link 1324 of the arm assembly. The third link 1326 may be driven through a two-stage belt/band drive from a third rotary axis of the drive unit. The first stage of the belt/band drive may include of pulley 1340, pulley 1342 and belt/band 1344, and the second stage of the belt/band drive may comprise pulley 1346, pulley 1348 and belt/band 1350. Pulley 1340 may be driven directly by the third rotary axis of the drive unit 1318, pulleys 1338 and 1346 may be coupled together, and pulley 1348 may be attached to the third link 1326 of the arm assembly.

The end-effector 26 may be actuated by a first actuator 48, which may control the orientation of the end-effector relative to the third link of the arm assembly. For example, the first actuator may include an electric motor, a piezoelectric actuator or any other suitable actuation arrangement. The first actuator may also include a position measurement device 100 to determine angular orientation of the end-effector with respect to the third link of the arm assembly. The active components of the first actuator, e.g., the stator of an electric motor, may be housed in an airtight vessel 50 and separated from the passive components, such as the rotor of an electric motor, by a separation barrier. The first actuator 48 may be connected to a cooling subsystem, such as the exemplary cooling subsystem discussed above.

The first actuator 48 may be controlled by the first controller unit 52, which may be coupled to the third link of the arm assembly. The first controller unit may be housed in the same airtight vessel 50 as the first actuator or located in another airtight vessel. The first controller unit 52 may be connected to a cooling subsystem, such as the exemplary cooling subsystem described above for example. The first controller unit 52 may process signals provided by the position sensing device 100 in the first actuator and provide control signals to the first actuator 48, e.g., energize windings of an electrical motor incorporated into the actuator. The first controller unit 52 may receive power and communicate with the robot controller through a power distribution and communication subsystem 73.

The power distribution and communication subsystem 73 may include electrical rotary couplings located at or associated with each rotary joint of the robotic manipulator. The rotary couplings may transmit power from the robot controller to the first controller unit and other active components of the arm assembly, such as a gripper and sensors on the end-effector.

As an alternative embodiment of the arm assembly shown in FIG. 13, the third link 1326 of the arm assembly may be actuated by an actuator incorporated into the second link 1324, which may control the orientation of the third link 1326 relative to the second link 1324 of the arm assembly. For example, the actuator may include an electric motor, a piezoelectric actuator, or any other suitable actuation arrangement. The actuator may also include a position measurement device, to determine angular orientation of the third link with respect to the second link of the arm assembly. The active components of the actuator, e.g., the stator of an electric motor, may be housed in an airtight vessel and separated from the passive components, such as the rotor of an electric motor, by a separation barrier. The actuator may be connected to a cooling subsystem.

As yet another alternative embodiment of the arm assembly of FIG. 13, the third link 1326 of the arm assembly may be actuated by an actuator incorporated into the third link 1326, which may control the orientation of the third link 1326 relative to the second link 1324 of the arm assembly.

Figure 14:
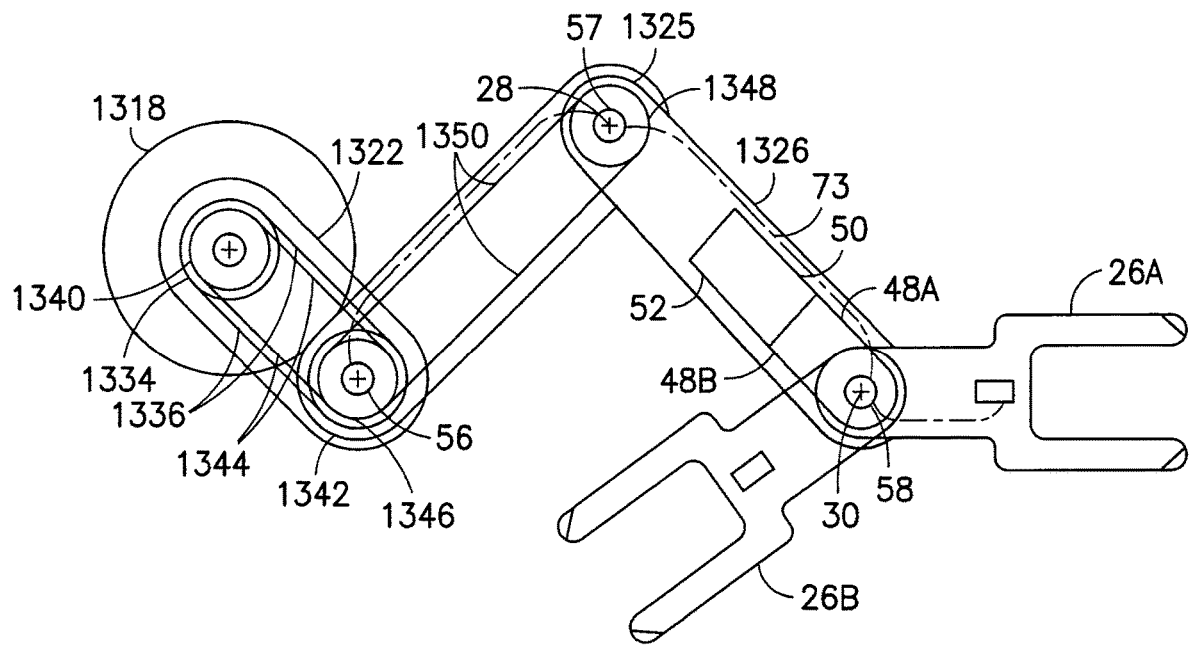
FIG. 14 is a top view similar to FIG. 2 of another alternate substrate transport apparatus of the substrate processing apparatus shown in FIG. 1.
Figure 15:
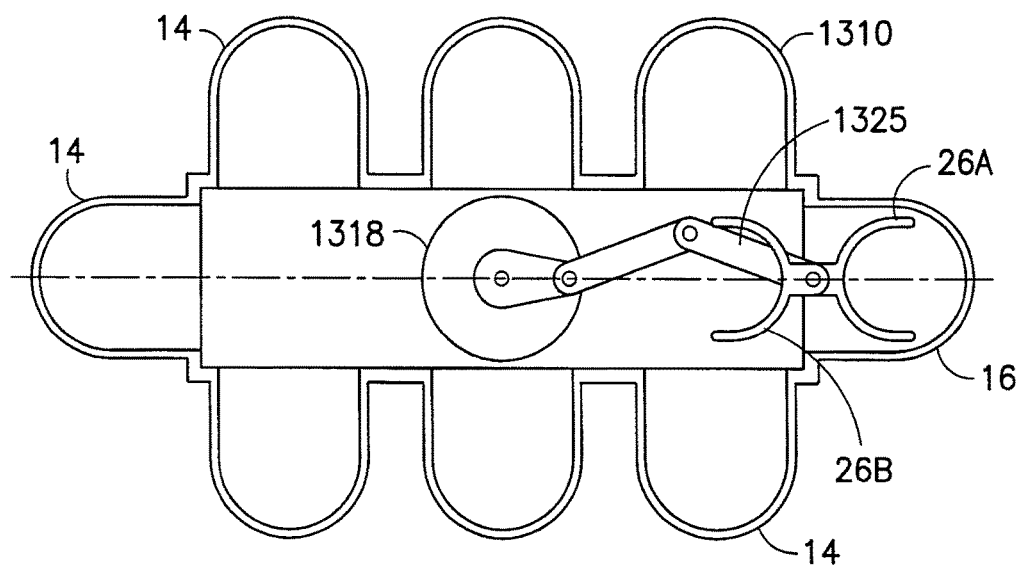
FIG. 15 is a schematic top view of the apparatus of FIG. 14 in a vacuum chamber.

Yet another example embodiment of the vacuum-compatible robot arm system is shown in FIGS. 14 and 15. In this example, the robot system may include of a drive unit 1318 with at least three rotary axes and an arm assembly 1325 coupled to the drive unit. The arm assembly may include of a first link 1322, a second link 1324, a third link 1326 and two end-effectors 26A, 26B, often referred to as the first end-effector and second end-effector. The first link 1322 may be attached directly to a first rotary axis of the drive unit, the second link 1324 may be coupled to the first link through a first rotary joint, the third link 1326 may be coupled to the second link via a second rotary joint, and the first and second end-effectors 26A, 26B may be coupled to the third link through a third rotary joint and a fourth rotary joint, respectively.

The first end-effector 16A may be actuated by a first actuator 48A, which may control the orientation of the first end-effector relative to the third link of the arm assembly. Similarly, the second end-effector 26B may be actuated by a second actuator 48B, which may control the orientation of the second end-effector relative to the third link of the arm assembly. For example, the first and second actuators may include an electric motor, a piezoelectric actuator, or any other suitable actuation arrangement. The first and second actuator may also include a position measurement device to determine angular orientation of the corresponding end-effector with respect to the third link of the arm assembly. The active components of the first and second actuators, e.g., the stator of an electric motor, may be housed in an airtight vessel and separated from the passive components, such as the rotor of an electric motor, by a separation barrier. A single airtight vessel may be used for both actuators or, alternatively, each actuator may be housed in its own airtight vessel. The first and second actuators may be connected to a cooling subsystem.

The first and second actuators 48A, 48B may be controlled by the first controller unit 52, which may be coupled to the third link of the arm assembly. The first controller unit may be housed in the same airtight vessel 50 as the first and second actuators or located in another airtight vessel. The first controller unit may be connected to a cooling subsystem as described above. The first controller unit 52 may process signals provided by the position sensing devices in the first and second actuators, and provide control signals to the first and second actuators, e.g., energize windings of electrical motors incorporated into the actuators. The first controller unit 52 may receive power and communicate with the robot controller through a power distribution and communication subsystem 73.

The power distribution and communication subsystem may include electrical rotary couplings located at or associated with each rotary joint of the robotic manipulator. The rotary couplings may transmit power from the robot controller to the first controller unit and other active components of the arm assembly, such as a grippers and sensors on the end-effectors. Alternatively, two separate controller units may be used, one for the first actuator and the other for the second actuator.

As another alternative embodiment of the arm assembly of FIG. 14, the third link of the arm assembly may be actuated by an actuator incorporated into the second link, which may control the orientation of the third link relative to the second link of the arm assembly. As an example, the actuator may include an electric motor, a piezoelectric actuator or any other suitable actuation arrangement. The actuator may also include a position measurement device to determine angular orientation of the third link with respect to the second link of the arm assembly. The active components of the actuator, e.g., the stator of an electric motor, may be housed in an airtight vessel and separated from the passive components, such as the rotor of an electric motor, by a separation barrier. The actuator may be connected to a cooling subsystem, such as described above.

As yet another alternative embodiment of the arm assembly of FIG. 14, the third link of the arm assembly may be actuated by an actuator incorporated into the third link, which may control the orientation of the third link relative to the second link of the arm assembly. For example, the actuator may include an electric motor, a piezoelectric actuator or any other suitable actuation arrangement. The actuator may also include a position measurement device to determine angular orientation of the third link with respect to the second link of the arm assembly. The active components of the actuator, e.g., the stator of an electric motor, may be housed in an airtight vessel and separated from the passive components, such as the rotor of an electric motor, by a separation barrier. The actuator may be connected to a cooling subsystem, such as the exemplary cooling subsystem discussed above. FIG. 15 shows the assembly 1325 in an apparatus 1510 having process modules 14 and a load lock 16.

As a further example embodiment of some features, the arrangements for end-effector phasing and actuation discussed above may be applied to dual-arm robotic manipulators. The arrangements for end-effector phasing may be applied to both arms/end-effectors of the dual-arm robotic manipulators or to one of the two arms/end-effectors of the dual-arm robotic manipulators.

Figure 16A:
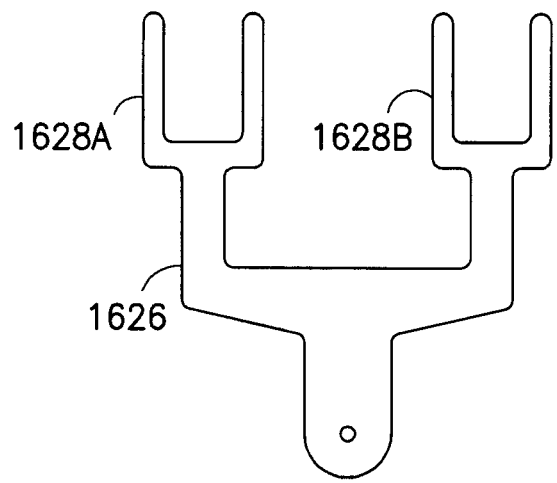
FIGS. 16A and 16B are top views of different types of end effectors.
Figure 16B:
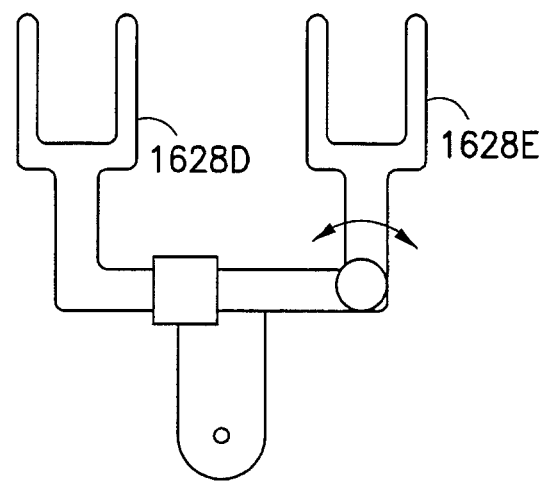
Figure 16C:
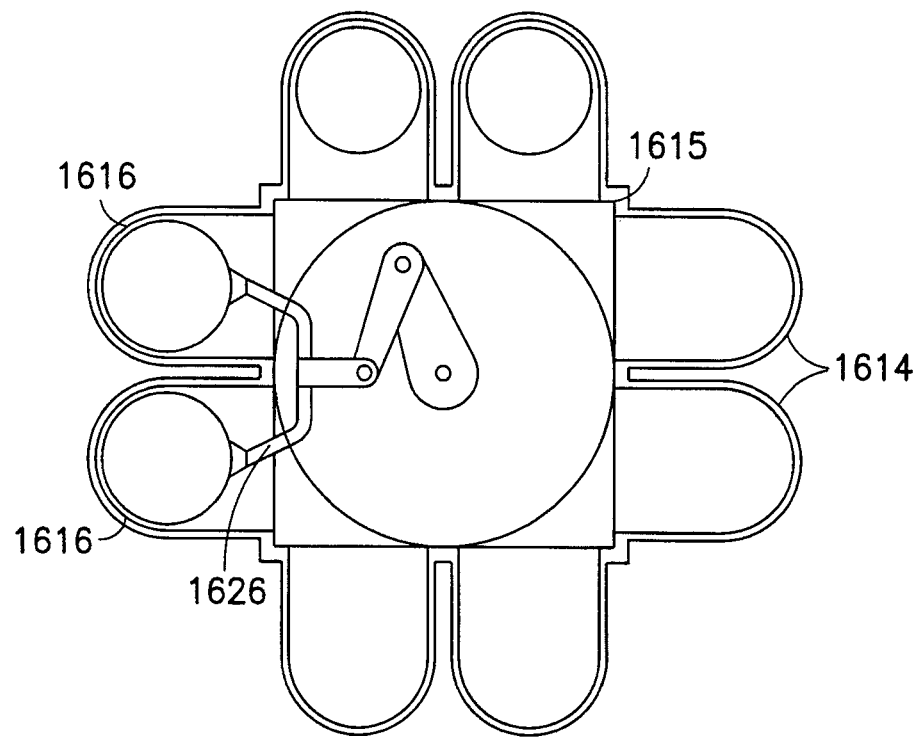
FIG. 16C is a schematic top view of the arm of FIG. 2 with the end effector of FIG. 16A in a vacuum chamber.

The exemplary arm assemblies discussed above may utilize dual-substrate side-by-side end-effectors, as shown in FIGS. 16A, 16B and 16C. In one example, the dual-substrate side-by-side end-effector 1626 may comprise of two substrate holders 1628A, 1628B that are connected in a substantially rigid manner. In another example, the two substrate holders 1628D, 1628E may be arranged in a movable manner so that the relative distance between the two substrate holders and/or the relative orientation of the substrate holders may be adjusted in an active manner. FIG. 16C shows a robot arm assembly with the arm 1626 being used in an apparatus having vacuum chamber 1615, process modules 1614, and load locks 1616.

Figure 17:
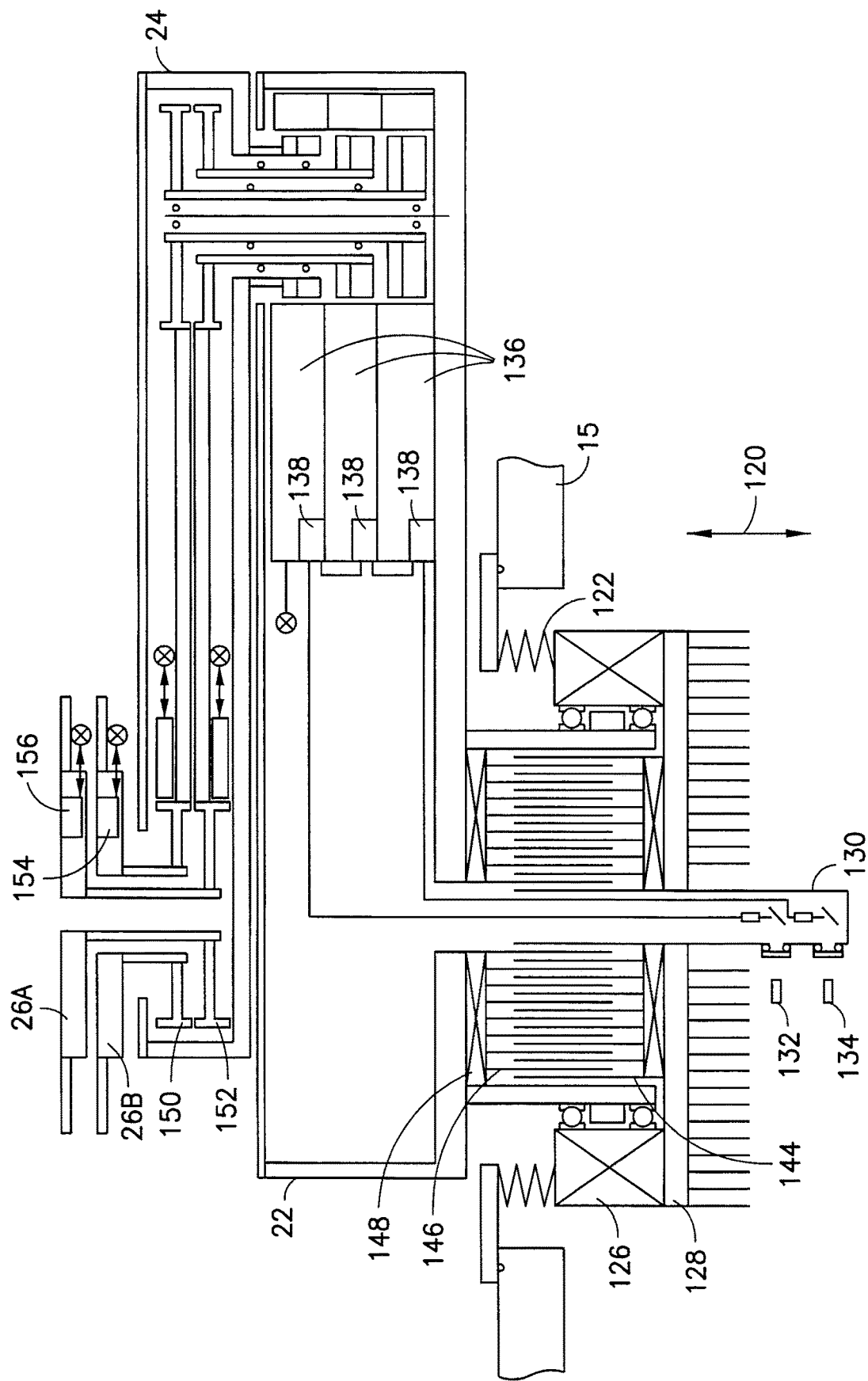
FIG. 17 is a schematic cross sectional diagram showing the cooling system of FIG. 8 attached to the apparatus of FIG. 12.

Referring also to FIG. 17, a schematic diagram of the drive 18 and cooling system of FIG. 8 is shown with the arm 1225 of FIG. 12. The power coupling may be a contactless inductive transformer where power and/or communications may be fed in a contactless manner. Alternately, power and/or data may be transmitted with a contact based or other suitable slip ring or coupling. Contactless optical feed through 130 having first and second fiber optic channels 132, 134 that feed high speed communication to controller(s) 136 in link 22. Here, controllers 136 may have optic to ethercat or other suitable conversion devices 138. Alternately, device 138 and feed through 130 may be inductive, for example, a coupler that transmits both power and high frequency signals or data, such as CAN or otherwise and used in combination with wires, flexures or otherwise. A suitable contactless optical feed through may utilize stationary grin lenses and stationary mirrors. An example of such feed through is provided by Moog Components Group however adapted for vacuum use. Alternately, any suitable coupling or feed through may be provided. Here, contactless fiber optic high speed communication coupled with contactless rotary power provide controller(s) 136 that which is necessary to drive arm. In addition to the high speed communication coupling, a non-contact inductive power coupling may be provided. Module(s) 136 may have control and motor drive circuitry, position encoding read head(s), inputs or outputs for external devices such as thermoelectric cooler 148 or other read heads and edge grip actuators or otherwise. For example, encoders 150, 152 may be directly coupled to wrist joints associated with end effectors 26A, 26B with read heads interfacing with module 136. Similarly, edge detection devices or edge grip or edge location devices 154, 156 may be coupled to end effectors 26A, 26B and interfacing with module 136.

In the disclosed embodiment, encoders may be provided at some or each joint, motors may be provided at some of or each joint, the combination of motors, encoders and controllers may be provided at some of or each joint. In alternate aspects, components within module(s) 136 may be exposed, encapsulated, encapsulated within a sealed metal enclosure, encapsulated within the body of arm 112, encapsulated within a partial metal enclosure or combination thereof. Power and communication may be by cable and stationary feed through, contactless magnetic slip ring, contact based slip rings, through isolated bearing(s), flexures or otherwise or combinations thereof. Thermal sinking may be by radiation cooling, or by convection and conduction, for example, where a cooling medium is passed through a feed through; either stationary or rotary. In alternate aspects, one or more axes may be provided with a feed through, for example, ferrofluidic or other suitable seal. In alternate aspects, more arms, for example concentric with or offset from drive may be provided having one, more or all independent axes of motion. Additionally, more or less cooling may be provided, for example, where one or more thermoelectric coolers may not be provided or where additional thermoelectric coolers may be provided. Further, a heat pump may be provided to transfer heat from one portion of the arm or drive to another for dissipation.

Figure 18:
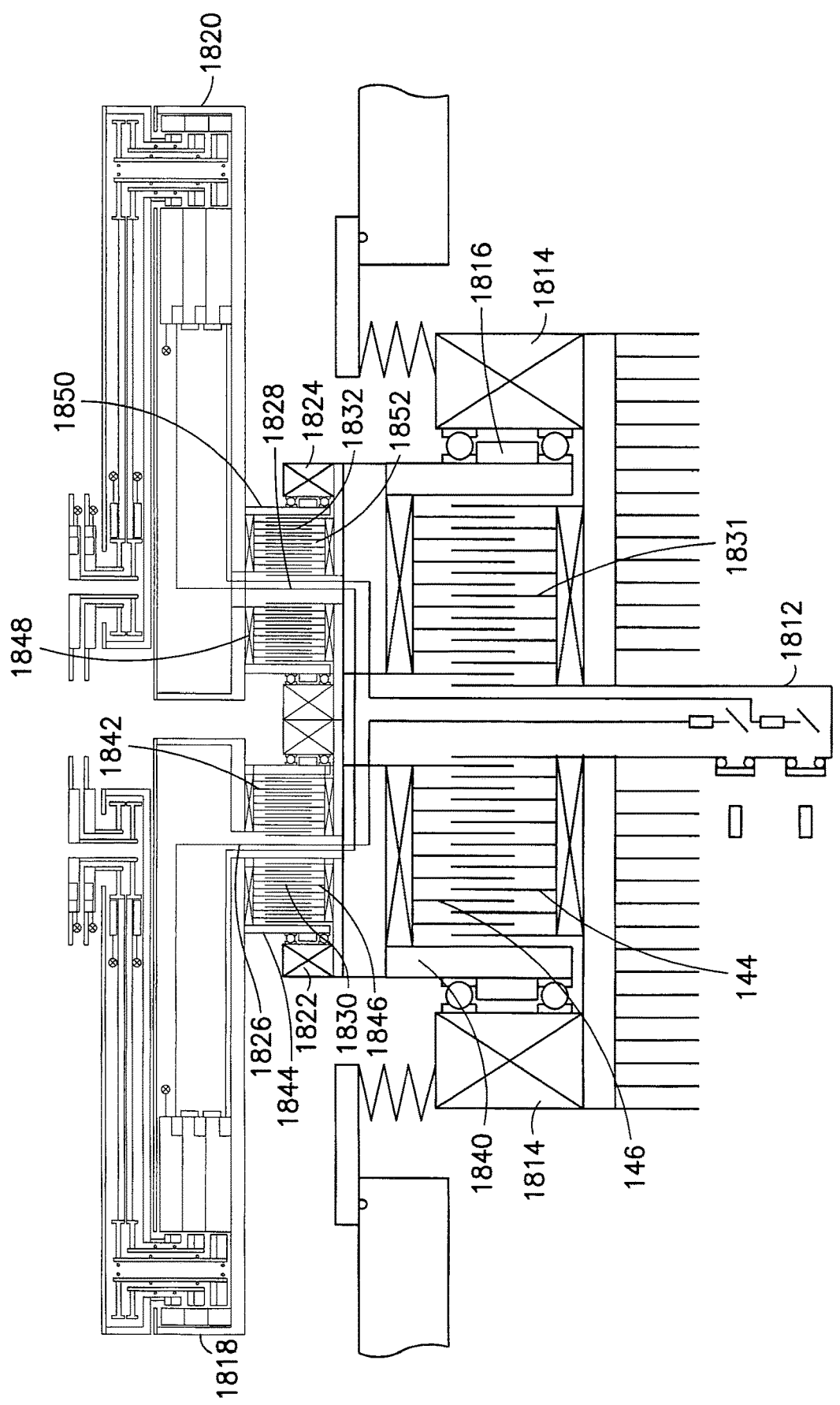
FIG. 18 is a schematic cross sectional diagram similar to FIG. 17 of an alternate example embodiment.

Referring also to FIG. 18, a schematic diagram of a transport apparatus is shown having a rotary and vertical drive with an optical feed through 1812 and rotary thermal feed through, for example as described with respect to FIG. 17. The rotor 1816 of has two independent arms 1818, 1820 movingly mounted thereto by respective rotary drives 1822, 1824. Rotary drives 1822, 1824 similarly have optical couplings 1826, 1828 and thermal couplings 1830, 1832. In alternate aspects, more or less arms, axes directly or remotely driven may be provided. In this embodiment heat is dissipated through a series of joints and through a series of thermal couplings, 1830 to 1831 and 1832 to 1831 respectively. In alternate aspects, more or less joints may be provided. For example, two or more arms that may be operable independently in one, some or all axes where each arm may have a main link driven concentric with respect to a common axis or other suitable arrangement.

Figure 19:
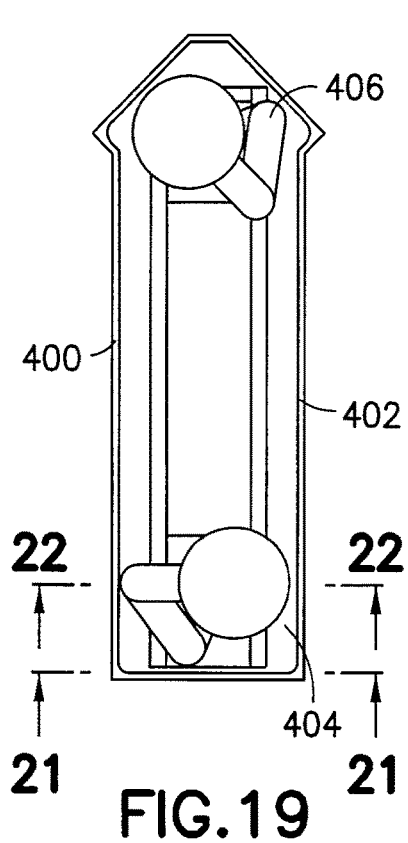
FIG. 19 is a schematic top view of an example substrate transport apparatus.
Figure 20:
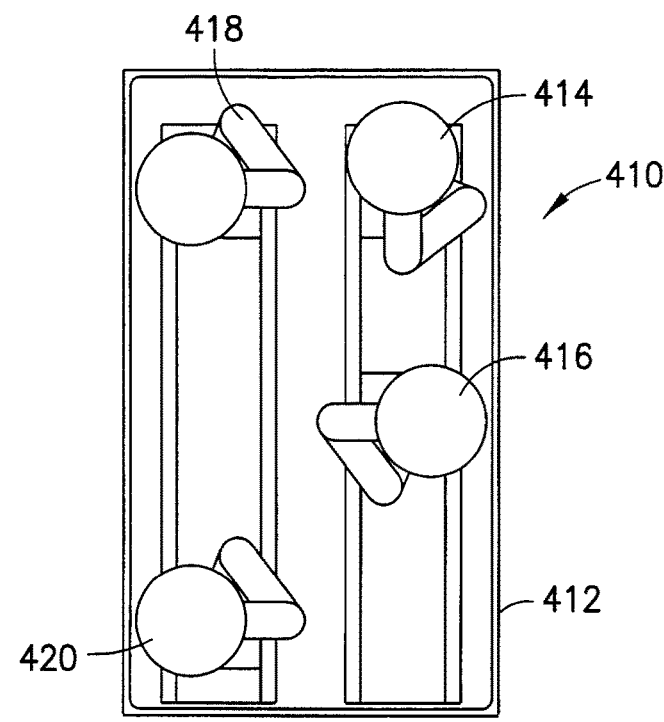
FIG. 20 is a schematic top view of an example substrate transport apparatus.

Referring also to FIG. 19 there is shown a block diagram of an example system 400. System 400 has vacuum chamber 402 and first and second transports 404, 406. Here, transport 404 is a combination linear and rotary drive and may be used, for example in linear tool configuration 400. Referring also to FIG. 20, there is shown system 410. System 410 has vacuum chamber 412 and transports 414, 416, 418, 420. The embodiment shown is merely exemplary. Accordingly, combinations of linear robots as shown, stationary robots or otherwise having more or less axis may be provided. For example, multiple stationary robots may be provided in one or more transport chambers an being serviced with a single or multi axis linear shuttle incorporating features as disclosed.

Figure 21:
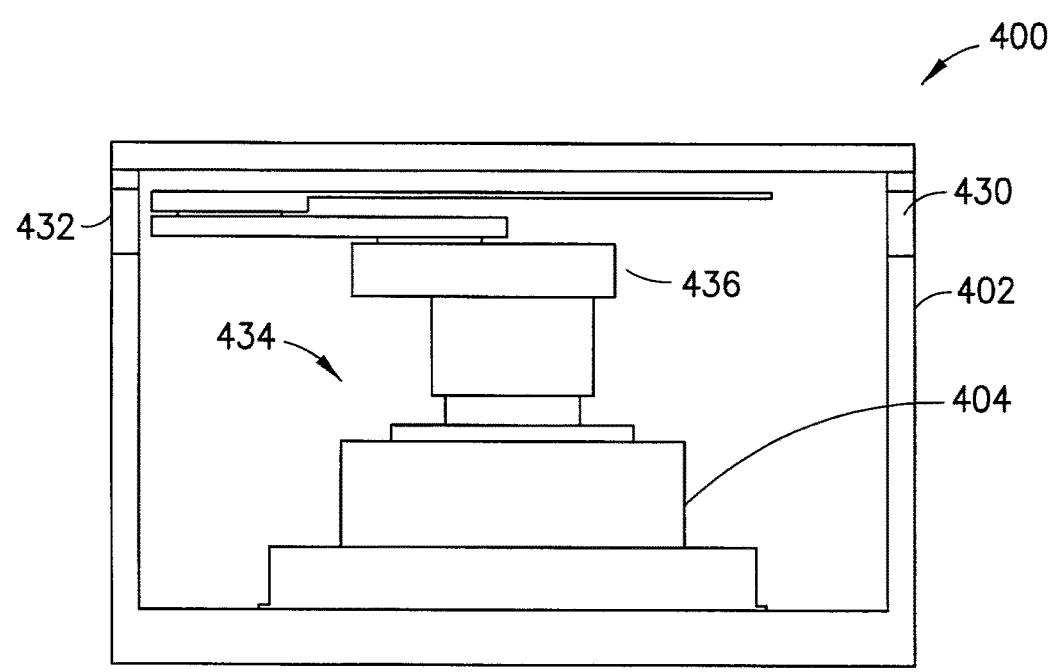
FIG. 21 is a schematic cross sectional view of the apparatus shown in FIG. 19 taken along line 21-21.
Figure 22:
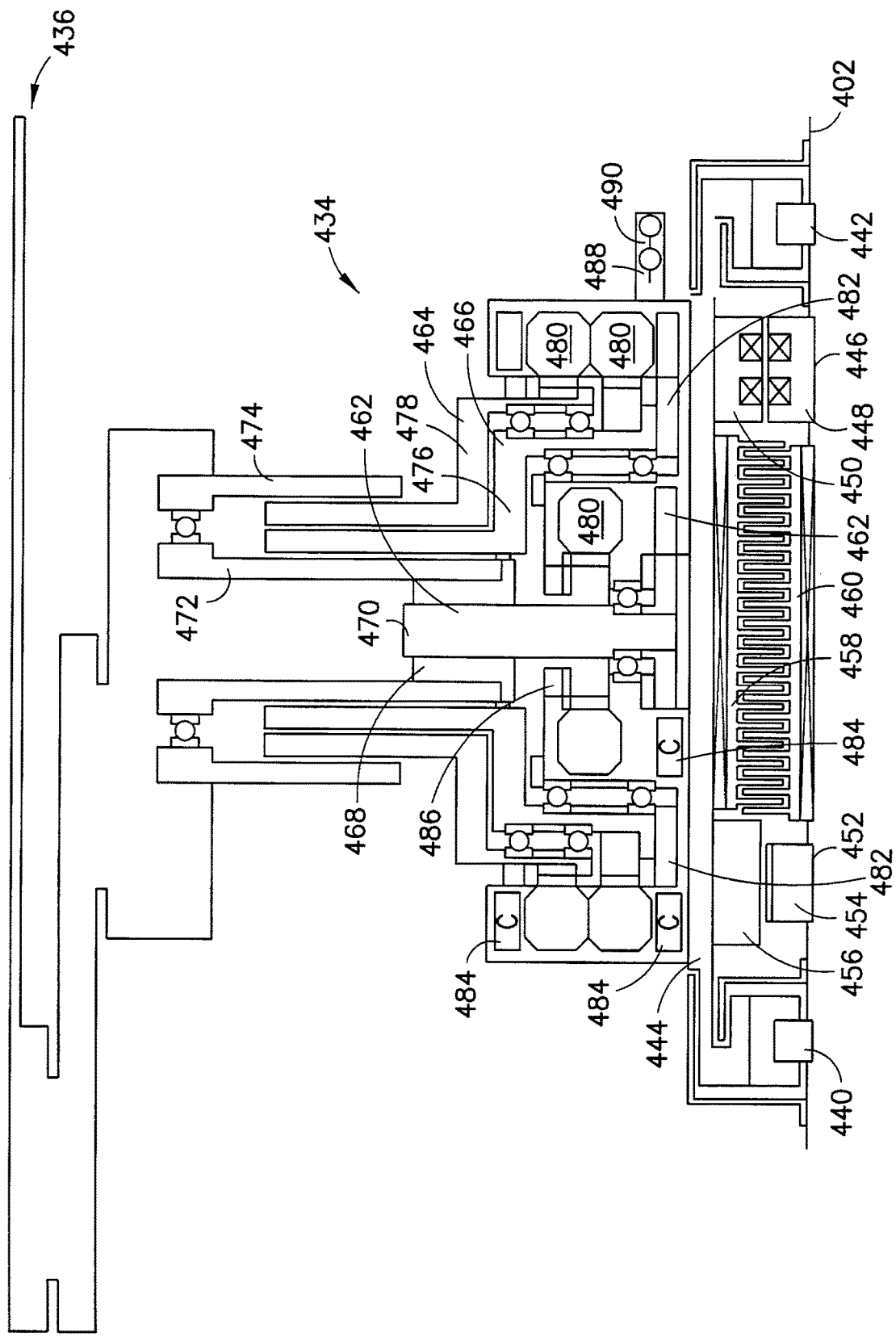
FIG. 22 is a schematic cross sectional view of the apparatus shown in FIG. 19 taken along line 22-22.

Referring also to FIG. 21, there is shown a cross section of system 400. Chamber 402 has slots 430, 432 through which substrates are inserted and removed. Transport or robot drive has drive portion 434 and arm portion 436, arm portion 436 may have features as disclosed or may be a scara type arm driven by drive portion 434. Referring also to FIG. 22, there is shown a partial cross section of system 400. Drive 434 is shown having slide components 440, 442 coupled to the floor of chamber 402. In alternate aspects, drive 434 may be coupled to an intermediate plate or otherwise. Components 440, 442 may be conventional linear slides or alternately may be magnetically suspended, non-contact slides, active, passive or otherwise. The embodiment shown does not require feed throughs and/or service loops for motion, cooling or power for example and in alternate aspects may employ one or more feed through and/or service loop. Slides 440, 442 are coupled to base or heat conductive plate 444. Here, heat generating components of drive 434 are thermally sinked to base 444. In alternate aspects, additional heat generating components may be provided thermally sinked to base 444 or another component or not at all, for example, where a heat generating component may be sunk to the surroundings by radiation or otherwise. Base 44 and the components mounted thereto traverse on slides 440, 442 to selectively access slots within chamber 402 of system 400. Power and/or communications may be provided with inductive coupling 446. Here, inductive coupling 446 may have base coupling 448 coupled to chamber 402 and pickup 450 coupled to plate 444. Here, base coupling 448 may run all or part of the length of chamber 402 providing pickup with 450 power and/or communications regardless of the location that drive 434 has traversed to selectively. More or less couplings 446 may be provided in line, in parallel or otherwise serving one or more drives simultaneously or independently or otherwise. Alternately, any suitable couplings may be provided, for example, as previously described, or for example, flexure based couplings for shorter distances for communication or otherwise. Base 444 is traversed by linear drive module 452 having stationary platen 454 coupled to chamber 402, for example, the length of the chamber to serve one or more drive and forcer 456 coupled to base 444. Here module 452 may be any suitable linear electric drive, for example a brushless linear motor having an active platen with magnets or a passive platen without magnets or otherwise. Drive module 452 may further have a position detection device that may be inductive, optical incremental, absolute or otherwise. Here, the read head may be packaged with or proximate to forcer 456 and the read track may be packaged proximate or with platen 454 or chamber 402. Heat may be transmitted from sink 458 mounted to base 444 to sink 460 mounted to chamber 402 where each sink may have interleaved surfaces to form a radiation coupling and where sink 460 may run the length of chamber 402. Drive 434 has active components that may generate heat, for example motor windings, encoder read heads, brakes, controllers and amplifiers, optical to ethercat couplings, rectifiers, power conditioners or any suitable heat generating components or components that are sensitive to heat. Such components may be thermally coupled or thermally sinked to base 444 such that base 444 may dissipate such heat via coupling 458, 460 or otherwise. Here, such components may be encapsulated in an enclosure, potted or partially encapsulated in an enclosure such that thermal energy may be transferred by such enclosure, potting or other suitable structure or coupling to base 444. For example, forcer 456 is thermally sinked directly to base 444. Linear motor 456 may have magnets in a stationary platen, or may have a magnet-less passive platen as described in U.S. Pat. No. 7,800,256 which is hereby incorporated by reference in its entirety. By way of further example, the rotary and vertical power elements of drive 434 may be enclosed and potted, for example, as shown or otherwise to thermally sink to base 444.

In the exemplary embodiment, exemplary arm 436 may be a scara arm having passive components such as bands, pulleys or otherwise or active components as such as encoders or motors or otherwise. The rotational and vertical portion of drive 434 has vertical drive 462, for example a lead screw drive or otherwise, and first and second rotary drives 464, 466. Screw 470 drives nut 468 of drive 462 which is shown, coupled to shaft 472 of rotary drive 466. Shafts 472, 472 are operably coupled to arm 436 to allow vertical movement, rotary movement and radial movement. Shafts 472, 472 are operably coupled to shafts 476, 478 of drives 466, 464 by prismatic joints that resist rotation to allow transmission of torque with freedom of vertical movement while holding the active components of the lower portion of drive 434 stationary with respect to base 444. Here, drives 462, 464, 466 may have active components, such as motor windings 480, read heads 482, electronic components or assemblies 484, brake windings 486 or other active components thermally sinked to base 444 as described. As earlier described, high speed communication may be by coupling 446 or alternately optically by one or more optical coupling(s) 488, 490 where such couplings may interface with corresponding coupling(s) in chamber 402 along a traversing axis of motion. In alternate aspects any suitable combination of modules or components as described herein may be provided.

Figure 24:
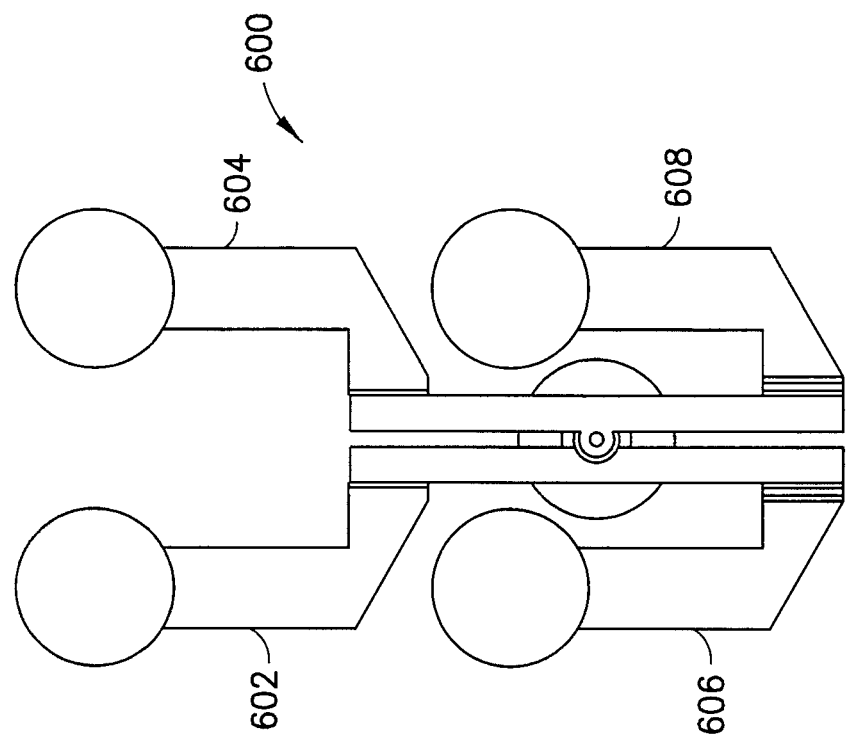
FIGS. 23-24 are schematic top views of an example substrate transport apparatus.
Figure 23:
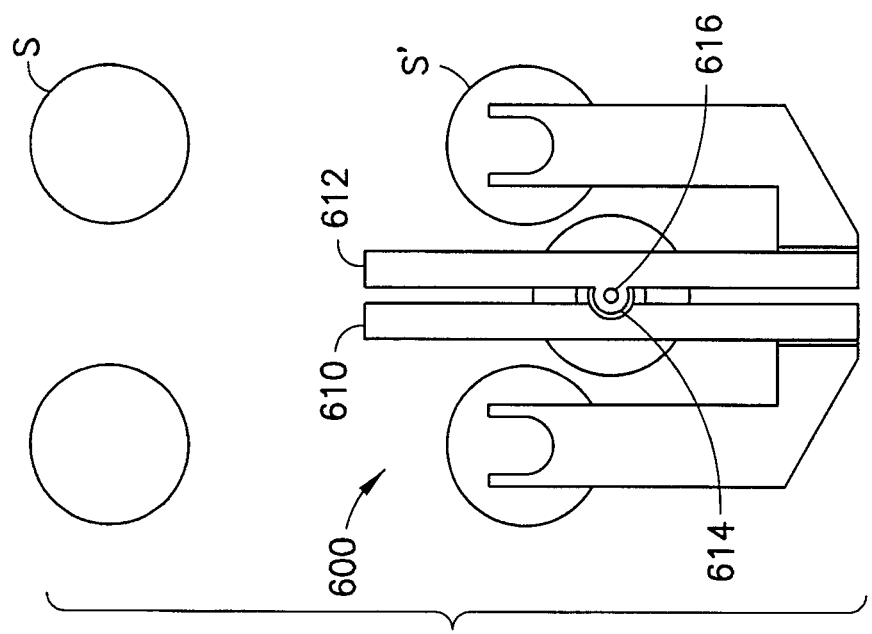

Referring now to FIG. 23, there is shown a view of drive 600 in a retracted position incorporating aspects of the disclosed embodiment. Referring also to FIG. 24, there is shown a view of drive 600 in an extended position incorporating aspects of the disclosed embodiment. Drive 600 has four radially independently moveable end effectors 602, 604, 606, 608. Further, end effectors 602, 606 are linearly mounted to linear drive 610 and end effectors 604, 608 are linearly mounted to linear drive 612. Linear drive 610 is mounted to rotary drive 614 and linear drive 612 is mounted to rotary drive 616 where rotary drives 614, 616 are independently rotatable. Here, two processed substrates S may be picked and two unprocessed substrates S' may be placed where, for example, the placed substrates may be placed simultaneously at two locations independent of the other. Here, error corrections may be corrected on the fly and independent of each other.

Figure 25:
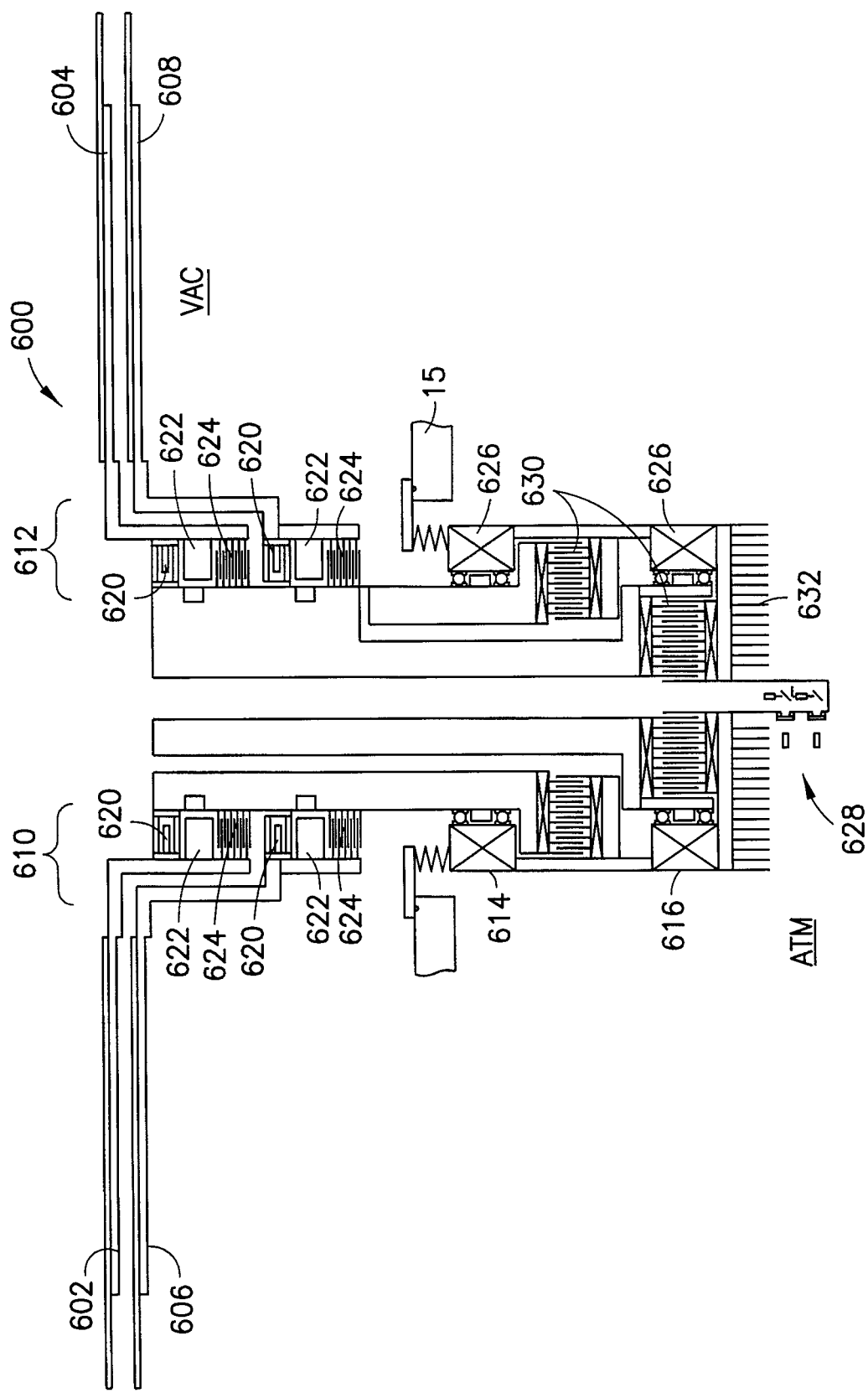
FIG. 25 is a schematic cross sectional view of the apparatus shown in FIGS. 23-24.

Referring also to FIG. 25, there is shown a cross section of drive 600. Each of linear drives 610 and 612 has two independent linear motor driven drives respectively coupled to end effectors 602, 606 and 604, 608. Linear drives 610, 612 and rotary drives 614, 616 may have features as shown and as disclosed herein with respect to other aspects of the disclosed embodiments. In this example embodiment the drive 600 includes linear motors 620 in four locations. In this example embodiment the drive 600 includes a power coupling, a communication coupling, and a linear positions sensor unit 622 in four locations. Heat transfers 624 are provided in four locations. Rotary drives 626 are provided in two locations including position encoders and power and communication couplings. A communications link 628 is provided. Heat exchangers 630 are provided along with a heat out exchanger 632.

Figure 26:
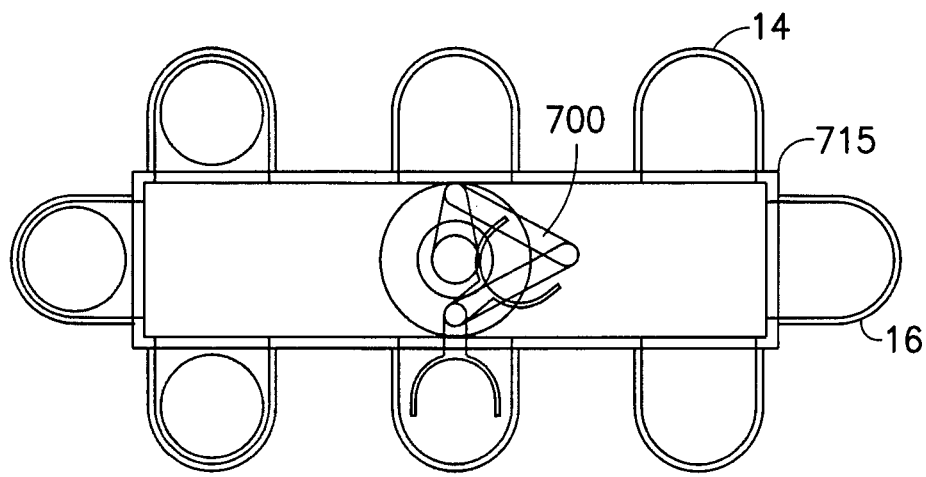
FIGS. 26-30 are schematic top views of example substrate processing apparatus.
Figure 27:
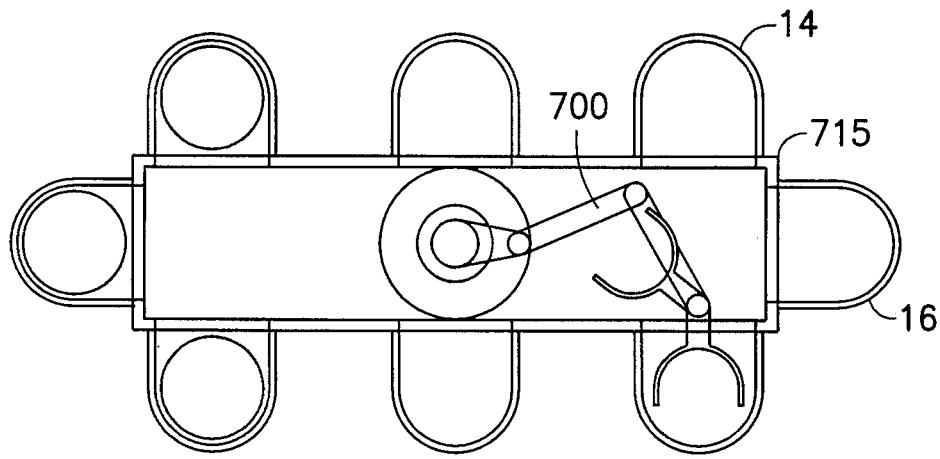
Figure 28:
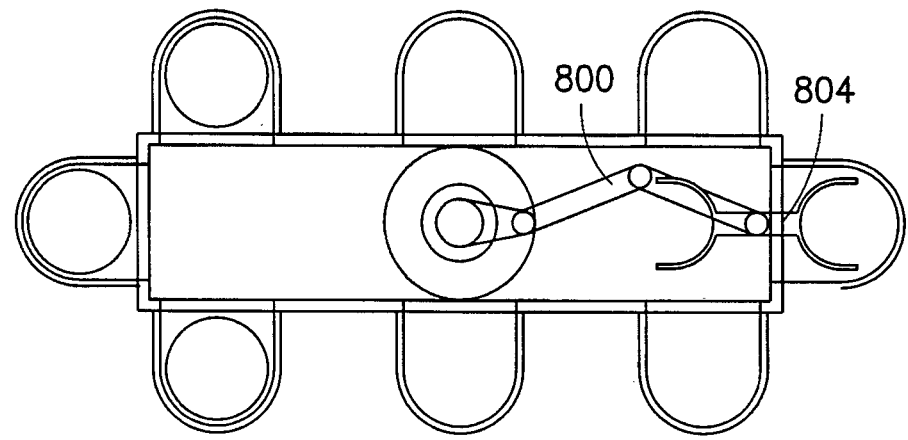
Figure 29:
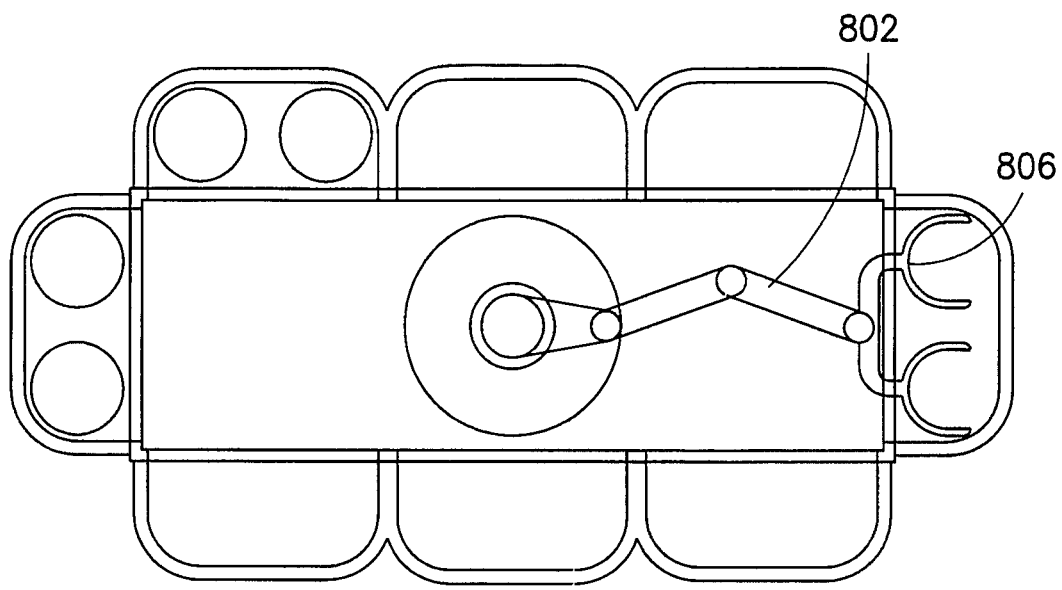
Figure 30:
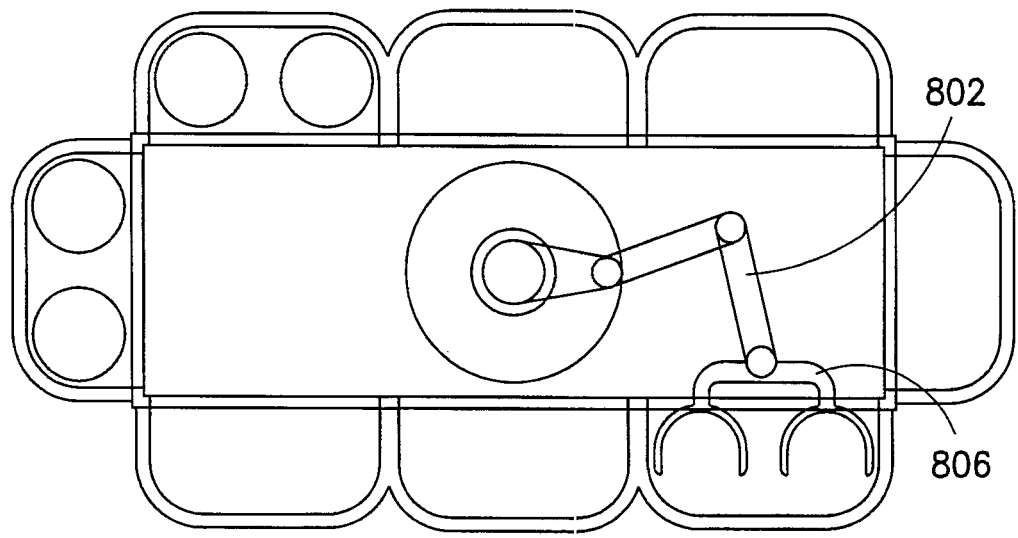

Referring now to FIGS. 26-28 there are shown various views of a linear platform with the three link arm robots 700, 800 with each having two end effectors 804 that are independently moveable. The robot 700 (800) is shown in a vacuum chamber 715 with process chambers 14 and load locks 16. Locks 16 may be a single load lock or stacked load locks. Alternately, one or more load locks may be provided adjacent lock 16 or otherwise located. In the embodiment shown, 7 process modules 14 are shown. Alternately, more or less process modules may be provided. Process module 14 may process a single wafer or more than one wafer, for example, with a carousel, stacked or batched wafers or stacked dependent or independent process modules. With the embodiment shown, robot 700 may independently access modules 14, 16 where three opposing pairs of modules are shown along a length on a linear platform with an opposing pair at the ends of the linear platform. Alternately more or less modules may be provided opposing, at the end or otherwise. Alternately, more than one platform may be connected together, for example, where one provides for input wafers that are subsequently processed in and transported through more than one platform and exiting through the input or at a distal of intermediate platform or otherwise. The dual end effectors shown allow for a fast swap at each module, for example where one end effector picks a processed substrate and the other then places an unprocessed substrate. Alternately, a single end effector, more end effectors, batch end effectors or other suitable end effector may be provided. Although one robot 700 is shown, more than one robot may be provided, for example, where more opposing process modules need access or where the required through put dictates additional handling capacity. Although a three link robot is shown, any suitable robot may be provided such as disclosed or otherwise. For example, a dual arm robot or a robot having more or less links or a robot having a combination of rotational and linear links and joints may be provided. Referring also to FIGS. 29-30 there are shown various views of a linear platform with a three link arm robot 802 with dual end effectors 806 that may be fixed with respect to each other or may alternately be independently moveable. The robot 802 is shown in a vacuum chamber with process chambers having two substrates processed in each and load locks. Locks may be a single load lock supporting two substrates or stacked load locks. Alternately, one or more load locks may be provided adjacent or otherwise located. In the embodiment shown, 7 process modules are shown. Alternately, more or less process modules may be provided. Each process module may process two wafer or more than two wafers, for example, with a carousel, stacked or batched wafers or stacked dependent or independent process modules. With the embodiment shown, robot 802 may independently access the modules where three opposing pairs of modules are shown along a length on a linear platform with an opposing pair at the ends of the linear platform. Alternately more or less modules may be provided opposing, at the end or otherwise. Alternately, more than one platform may be connected together, for example, where one provides for input wafers that are subsequently processed in and transported through more than one platform and exiting through the input or at a distal of intermediate platform or otherwise. The dual end effectors shown allow picking or placing two substrates at the same time. Alternately, an additional end effector may be provided for a fast swap at each module, for example where one end effector picks a pair of processed substrates and the other then places a pair of unprocessed substrates. Alternately, a single end effector, more end effectors, batch end effectors or other suitable end effector may be provided. Although one robot 800 is shown, more than one robot may be provided, for example, where more opposing process modules need access or where the required through put dictates additional handling capacity. Although a three link robot is shown, any suitable robot may be provided such as disclosed or otherwise. For example, a dual arm robot or a robot having more or less links or a robot having a combination of rotational and linear links and joints may be provided.

In one type of example embodiment, an apparatus 25 may be provided comprising a frame comprising at least three members including at least two links 22, 24 forming a movable arm and an end effector 26, where the end effector and the links are connected by movable joints, where the end effector is configured to support a substantially planar substrate thereon; a first position sensor 98 or 100 on the frame proximate a first one of the joints, where the first position sensor is configured to sense a position of two of the members relative to each other; and an airtight enclosure 50 on the movable arm, where the first position sensor is sealed, at least partially, in the an airtight enclosure.

The apparatus may further comprise a drive 18 connected to the frame, where the drive is configured to move the movable arm. The apparatus may further comprise a vacuum chamber 15, where the frame is located in the vacuum chamber and the drive extends through a wall in the vacuum chamber. The apparatus may further comprise a heat transfer system (see FIG. 8 for example) at the drive, where the heat transfer system is configured to transfer heat from the movable arm to a spaced distance from the movable arm. The apparatus may further comprise a controller 52 and/or 54 connected to the drive and/or the first position sensor. The first position sensor may be spaced from the drive. The first position sensor may comprise a position detection encoder. The apparatus may further comprise a second position sensor on the frame proximate a second one of the joints, where the second position sensor is configured to sense a position of two of the members relative to each other. The apparatus may further comprise an electrically powered actuator 48 on the frame located, at least partially, in the airtight enclosure 50 or in a second airtight enclosure. The first position sensor may be an optical encoder, and a fiber optic member 73B may extend from the first position sensor through the airtight enclosure 50. The apparatus may further comprise a controller 52 on the frame and connected to the optical encoder, where the controller 52 is located, at least partially, in the airtight enclosure 50 or in a second airtight enclosure. The airtight enclosure may be formed, at least partially, by one of the links 22, 24 of the frame. The apparatus may further comprise at least one electrical conductor 73C extending through the airtight enclosure.

The heat transfer system may comprise a first heat transfer member 146 connected to a first member 1840 of the drive and a second heat transfer 144, where the second heat transfer member 144 is located relative to the first heat transfer member to receive heat therefrom, and where the first heat transfer member 146 is moveable relative to the second heat transfer member as the first member 1840 of the drive is moved.

The heat transfer system may comprise a first pair 1830 of heat transfer members; and a spaced second pair 1832 of heat transfer members, where the first pair of heat transfer members 1830 comprise a first heat transfer member 1842 connected to a first member of the drive 1844 and a second heat transfer 1846, where the second heat transfer member 1846 is located relative to the first heat transfer member 1842 to receive heat therefrom, and where the first heat transfer member 1842 is moveable relative to the second heat transfer member as the first member 1844 of the drive is moved, where the second pair of heat transfer members 1832 comprise a third heat transfer member 1848 connected to a second member 1850 of the drive and a fourth heat transfer member 1852, where the fourth heat transfer member 1852 is located relative to the third heat transfer member 1848 to receive heat therefrom, and where the third heat transfer member 1848 is moveable relative to the fourth heat transfer member 1852 as the second member 1850 of the drive is moved. The heat transfer system may further comprise a third pair of heat transfer members comprises a fifth heat transfer member 146 connected to a third member 1840 of the drive and a sixth heat transfer member 144, where the sixth heat transfer member 144 is located relative to the fifth heat transfer member 146 to receive heat therefrom, and where the fifth heat transfer member 146 is moveable relative to the sixth heat transfer member 144 as the third member 1840 of the drive is moved. The second and fourth heat transfer members 1846, 1852 may be supported on the third member 1840 of the drive. The apparatus may be a planar substrate movement robot adapted to move a planar substrate in a vacuum chamber on the end effector.

Another example embodiment may be provided in an apparatus 12 comprising an electrical device 48 and/or 52 and/or 100; a frame 25 having the electrical device thereon, where the frame comprises at least three members including at least two links 22, 24 forming a movable arm and an end effector 26, where the end effector and the links are connected by movable joints, where the end effector is configured to support a substantially planar substrate thereon; a drive 18 connected to the movable arm, where the drive is configured to move the movable arm; and a heat transfer system (see FIG. 8 for example) at the drive, where the heat transfer system is configured to transfer heat from the movable are to a spaced distance from the movable arm.

Another example embodiment may be provided in an apparatus 12 comprising a frame comprising at least three members including at least two links 22, 24 forming a movable arm and an end effector 26, where the end effector and the links are connected by movable joints, where the end effector is configured to support a substantially planar substrate thereon; a first position sensor 100 on the frame proximate a first one of the joints, where the first position sensor is configured to sense a position of two of the members relative to each other; and a communications link 73 connected to the first position sensor, where the communications link is configured to transmit signals from the first position sensor to a device spaced from the movable arm through an airtight enclosure.

The term "joint" should be considered a broad term. For example, the joint may be a rotary joint, a prismatic joint or any other suitable type of joint. Likewise, the terms "link" and "member" should be considered broad terms including multiple elements connected together. Any suitable links or members could be provided.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A transport apparatus comprising:
   an arm configured to move a substrate thereon;
   a motor configured to drive the arm; and
   a motor control coupling connected to the motor,
   wherein the transport apparatus is configured to be located inside a chamber and be horizontally movable within the chamber,
   wherein the motor control coupling is configured to receive first signals from a controller located outside of the chamber, generate second signals configured to be used with the motor to move the arm based at least partially upon the first signals from the controller, and send the second signals to the motor, and
   wherein the motor control coupling is configured to communicate with the controller located outside of the chamber using at least one wireless communication device.

2. A transport apparatus as in claim 1 where the at least one wireless communication device comprises a first optical communication device connected to the motor.

3. A transport apparatus as in claim 2 where the at least one wireless communication device comprises a second optical communication device connected to the chamber, where the first and second optical communication devices are configured to optically interface with each other.

4. A transport apparatus as in claim 3 where the first and second optical communication devices are configured to optically interface with each other as the motor and arm move horizontally along an axis of motion inside the chamber.

5. A transport apparatus as in claim 1 further comprising the chamber, where the motor is located in an enclosure on a base of the transport apparatus, where the base is horizontally movable inside the chamber.

6. A transport apparatus as in claim 5 where the chamber has a different atmospheric pressure therein than an atmospheric pressure inside the enclosure.

7. An apparatus comprising:
   the transport apparatus as claimed in claim 1; and
   the chamber, where the chamber has the transport apparatus connected to the chamber, where the chamber is configured to have at least one substrate processing module connected thereto, and where the chamber is configured to at least partially provide an isolated environment inside the chamber which the chamber at least partially isolates from an environment outside of the chamber.

8. An apparatus comprising:
   a chamber;
   a robot comprising a robot arm and a robot motor, where the robot motor is configured to move the robot arm;
   a robot drive connecting the robot to the chamber, where the robot drive is configured to move the robot in a horizontal direction inside the chamber;
   a first wireless communication device connected to the chamber; and
   a second wireless communication device connected to the robot,
   where the first wireless communication device is configured to wirelessly transmit signals to the second wireless communication device, and where the robot is configured to use the signals received by the second wireless communication device to control movement of the robot motor.

9. An apparatus as in claim 8 where the robot drive is located in an airtight enclosure on a movable base of the robot drive.

10. An apparatus as in claim 9 where the airtight enclosure is located in the chamber.

11. An apparatus as in claim 10 where the chamber is configured to have at least one substrate processing module connected thereto, and where the chamber is configured to at least partially provide an isolated environment inside the chamber which the chamber at least partially isolates from an environment outside of the chamber, and where the airtight enclosure is configured to allow for a different pressure inside the enclosure than a pressure inside the chamber.

12. An apparatus as in claim 8 where the first wireless communication device is an optical wireless communication device.

13. An apparatus comprising:
    a chamber;
    a robot motor;
    a robot drive, where the robot motor is connected to the chamber with to the robot drive, and where the robot drive is configured to move the robot motor in a horizontal direction inside the chamber;
    a robot arm connected to the robot motor, where the robot motor is configured to move the robot arm; and
    a first portion of a communications coupling connected to the robot motor, where the first portion of the communications coupling is configured to move with the robot motor in the horizontal direction inside the chamber, where the first portion of the communications coupling is configured to send movement drive signals to the robot motor, and where the first portion of the communications coupling is configured to wirelessly communicate with a second portion of the communications coupling located outside of the chamber, where the first portion of the communications coupling is configured to wirelessly communicate with the second portion of the communications coupling for a plurality of different horizontal locations of the first portion of the communications coupling inside the chamber.

14. An apparatus as in claim 13 where the robot motor is located in an airtight enclosure.

15. An apparatus as in claim 14 where the airtight enclosure is located in the chamber.

16. An apparatus as in claim 14 where the robot drive comprises a base mounted to the chamber by slides, where the robot motor is mounted on the base, and where the slides provide a horizontal path for the robot drive to move the robot motor in the horizontal direction inside the chamber.

17. An apparatus as in claim 15 where the chamber is configured to have at least one substrate processing module connected thereto, and where the chamber is configured to at least partially provide an isolated environment inside the chamber, which the chamber at least partially isolates from an environment outside of the chamber, and where the airtight enclosure is configured to allow for a different pressure therein than a pressure inside the chamber.

18. An apparatus as in claim 13 where the first portion of the communications coupling is a first optical wireless communication device.

19. An apparatus as in claim 18 further comprising the second portion of the communications coupling connected to the chamber, where the second portion of the communications coupling is a second optical wireless communication device configured to interface with the first optical wireless communication device.

20. A method comprising:
    connecting a robot to a chamber with a robot drive, where the chamber is configured to have at least one substrate processing module connected thereto, where the chamber is configured to at least partially provide an isolated environment inside the chamber which the chamber at least partially isolates from an environment outside of the chamber, where the robot drive is configured to move the robot in a horizontal direction inside the chamber, where the robot comprising a robot arm and a robot motor, and where the robot motor is configured to move the robot arm;
    connecting a first wireless communication device to the chamber outside of the chamber; and
    connecting a second wireless communication device to the robot, where the first wireless communication device is configured to wirelessly transmit motor control signals to the second wireless communication device, and where the robot is configured to use the motor control signals received by the second wireless communication device to control movement of the robot motor.

21. A method comprising:
    providing a robot inside a chamber, where the chamber is configured to have at least one substrate processing module connected thereto, where the chamber is configured to at least partially provide an isolated environment inside the chamber which the chamber at least partially isolates from an environment outside of the chamber, where the robot is connected to the chamber by a robot drive configured to move the robot in a horizontal direction along a linear length inside the chamber, where the robot comprising a robot arm and a robot motor, where the robot motor is configured to move the robot arm, where a first wireless communication device is located outside of the chamber, and where a second wireless communication device is connected to the robot; and
    transmitting signals wirelessly from the first wireless communication device to the second wireless communication device; and
    based upon the signals transmitted from the first wireless communication device to the second wireless communication device, at least partially controlling movement of the robot motor at different linear locations of the robot along the linear length inside the chamber.

* * * * *